United States Patent
Wang et al.

(10) Patent No.: US 10,411,712 B2
(45) Date of Patent: Sep. 10, 2019

(54) FPGA HAVING PROGRAMMABLE POWERED-UP/POWERED-DOWN LOGIC TILES, AND METHOD OF CONFIGURING AND OPERATING SAME

(71) Applicant: Flex Logix Technologies, Inc., Mountain View, CA (US)

(72) Inventors: Cheng C. Wang, San Jose, CA (US); Anthony Kozaczuk, Burlingame, CA (US); Valentin Ossman, Livermore, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/042,170

(22) Filed: Jul. 23, 2018

(65) Prior Publication Data

US 2019/0028104 A1    Jan. 24, 2019

Related U.S. Application Data

(60) Provisional application No. 62/536,344, filed on Jul. 24, 2017.

(51) Int. Cl.
*H03K 19/177* (2006.01)
*G06F 17/50* (2006.01)

(52) U.S. Cl.
CPC ... *H03K 19/17796* (2013.01); *G06F 17/5054* (2013.01); *H03K 19/17704* (2013.01); *H03K 19/17744* (2013.01); *H03K 19/17772* (2013.01)

(58) Field of Classification Search
CPC ....... H03K 19/17796; H03K 19/17744; H03K 19/17704; H03K 19/17772; G06F 17/5054

USPC .......................................................... 326/41
See application file for complete search history.

(56) References Cited

U.S. PATENT DOCUMENTS

| | | | |
|---|---|---|---|
| 6,160,418 A | 12/2000 | Burnham | |
| 7,078,932 B2 * | 7/2006 | Swami | H03K 19/0016 326/38 |
| 8,497,702 B2 * | 7/2013 | Hill | H03K 19/17772 326/39 |
| 2002/0135398 A1 * | 9/2002 | Choi | H03K 17/28 326/93 |
| 2010/0156457 A1 * | 6/2010 | Greene | H03K 19/17784 326/39 |

OTHER PUBLICATIONS

International Search Report and Written Opinion of International Searching Authority, dated Oct. 3, 2018, 9 pages.

* cited by examiner

*Primary Examiner* — Daniel D Chang

(74) *Attorney, Agent, or Firm* — Neil A. Steinberg

(57) ABSTRACT

An integrated circuit comprising a field programmable gate array including a plurality of logic tiles, wherein, during operation of the field programmable gate array, each logic tile is configurable to connect with at least one logic tile of the plurality of logic tiles, and wherein each logic tile of the plurality of logic tiles includes an interconnect network, including a plurality of multiplexers, and logic circuitry. The field programmable gate array, in a first operational mode, includes a first group of logic tiles that are programmed in a powered-up state wherein each logic tile of the first group of logic tiles consumes electrical power during operation, and a second group of logic tiles of the plurality of logic tiles are programmed in a powered-down state wherein each logic tile of the second group of logic tiles does not consume electrical power during operation.

20 Claims, 24 Drawing Sheets

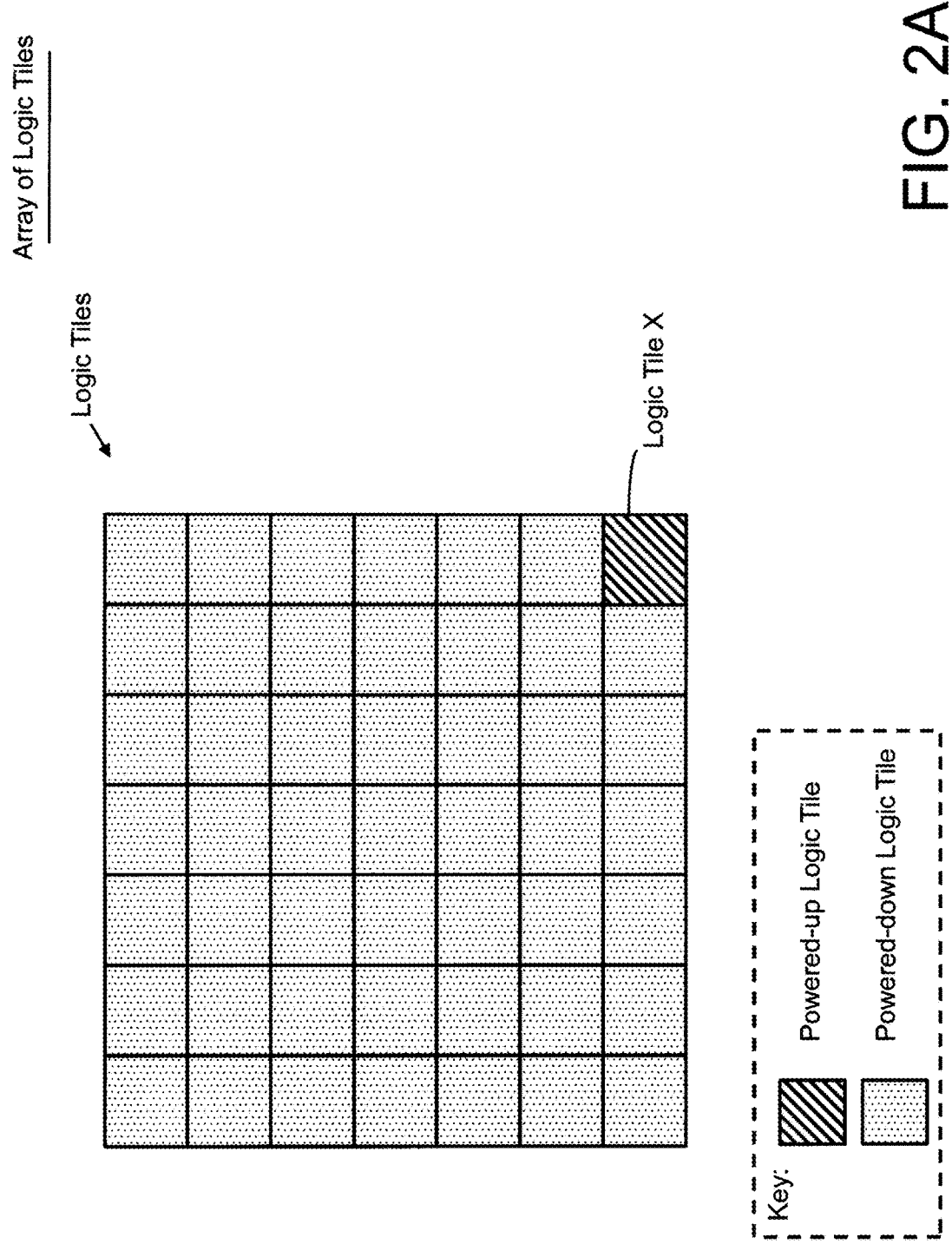

FPGA HAVING PROGRAMMABLE POWERED-UP/POWERED-DOWN LOGIC TILES, AND METHOD OF CONFIGURING AND OPERATING SAME

RELATED APPLICATION

This non-provisional application claims priority to and the benefit of U.S. Provisional Application No. 62/536,344, entitled "FPGA having Programmable Powered-Up/Powered-Down Logic Tiles, and Method of Configuring and Operating Same", filed Jul. 24, 2017. The '344 provisional application is incorporated herein by reference in its entirety.

INTRODUCTION

In one aspect, the present inventions are directed to an integrated circuit including a field programmable gate array (FPGA) disposed therein/thereon (hereinafter collectively "therein") wherein the FPGA includes programmable/configurable logic circuitry having an array or a plurality of tiles having programmable components ("tiles" are often called "configurable logic blocks" (CLB), "logic array blocks" (LAB), or "logic tiles"—hereinafter collectively "logic tiles") and, in one embodiment, a network of configurable interconnects that facilitate communication between logic tiles as well as internally within logic tiles. In the present inventions, one or more (or all) of the logic tiles of the FPGA may be programmed, configured or maintained in a powered-up state or a powered-down state, for example, on an individual logic tile basis and/or on a group of logic tiles basis. In one embodiment, the logic tiles include programmable or configurable power-on/power-off circuitry to respectively control the power state of one, some or all (or certain portions) of the logic tile. Control circuitry, via one or more control signals, may control or determine the power state of one or more (or all) of the logic tiles via control of the power-on/power-off circuitry associated with one or more logic tiles. For example, in one embodiment, control circuitry may establish the power state of the logic tile by programming or configuring power-on/power-off circuitry to partially or completely control, remove and/or terminate electrical power provided or applied to and/or consumed or generated by one or more of the logic tiles (and/or portion(s) of the circuitry of one or more of the logic tiles of the array or plurality).

In one embodiment, the power-on/power-off circuitry is entirely or partially disposed in the logic tile. For example, the power-on/power-off circuitry may be one or more switches that responsively connect or disconnect the associated logic tile to/from electrical power (for example, a power supply or regulator of the logic tile or integrated circuit and/or a power conductor or plane of the integrated circuit). In another embodiment, the power-on/power-off circuitry is located at the electrical power interface of the associated logic tile. In yet another embodiment, the power-on/power-off circuitry is a control circuit disposed in the local power generation circuitry of the logic tile (e.g., the power supply and/or power regulator) which enables/disables consumption, generation or distribution of electrical power within the logic tile.

In another embodiment, the power-on/power-off circuitry is disposed entirely external to the logic tile. For example, the power supply which generates or regulates electrical power for the FPGA may include power-on/power-off circuitry which responsively determines which logic tiles of the array of logic tiles (i) consume or are provided or (ii) do not consume or are not provided electrical power. In this embodiment, control circuitry, for example, disposed on the integrated circuit but external to the logic tiles or array of logic tiles of the programmable/configurable logic circuitry, determines or controls whether one or more logic tile is/are provided or receives or consume(s) electrical power, for example, provided from other circuitry on the integrated circuit (e.g., the "central" power supply or power regulator).

In one aspect, the power state of the logic tiles of the array of logic tiles is programmable or controllable on an individual logic tile basis. For example, the control circuitry may individually control the power-up/power-down circuitry (e.g., one or more switches which connect or disconnect power) of one or more logic tiles to individually and separately establish, provide and/or maintain a power state of such logic tiles—for example, determine whether a logic tile (or group of logic tiles) receives power from, for example, a power supply or regulator and/or a power plane/conductor of the integrated circuit. In another embodiment, the power state of a plurality of logic tiles of the array is programmable or controllable on a group or block of logic tiles basis. That is, the power state for a plurality of logic tiles (for example, a plurality of contiguous logic tiles) is controlled or determined as a group or together wherein control circuitry establishes, provides or controls the power-up/power-down circuitry (e.g., one or more switches) of the group(s) or block(s) of logic tiles to establish, provide and/or maintain a power state of such logic tiles—for example, determine whether group(s) or block(s) of logic tiles receive power from, for example, a power supply or regulator and/or a power plane/conductor of the integrated circuit.

Indeed, in one configuration, the power state of one or more of the logic tiles may be partially powered-down during normal operation of the FPGA (i.e., a portion of the circuitry of the logic tile receives electrical power and a second portion (e.g., the remaining portion) of the circuitry in the one or more logic tiles does not) and/or the power state of one or more of the other logic tiles may be completely powered-down during normal operation of the FPGA (i.e., none of the circuitry of the logic tile receives current or electrical power; that is, no electrical power is provided or applied to and/or consumed or generated by the logic tile). The partial powered-down state may include removing, terminating or not providing electrical power to one or more portions of the logic tile such as, for example, the interconnect network (or a portion thereof), the computing elements (or a portion thereof), the logic circuitry that is configurable to perform combinational and/or sequential operations, clock generation or clock control circuitry, control circuitry and/or the I/O circuitry (or a portion thereof) whereas certain portions of the logic tile(s) are powered-up (for example, I/O circuitry or a portion thereof to, e.g., output or provide a known or fixed data state to, e.g., external circuitry or interconnect network of one or more other logic tiles of the plurality of logic tiles connected thereto). Notably, normal operation of the FPGA does not include the process of configuring or re-configuring the FPGA, including configuring and/or re-configuring one or more (or all) of the logic tiles of the FPGA.

In one embodiment, the power state of the logic tiles may be configured and/or programmed at, for example, power-up or start-up, during initialization or re-initialization, and/or in response to reset or the like sequence/operation (which may be before, during/concurrently or after configuration of the logic tiles of the array of logic tiles). The power state of the logic tiles thereafter may be (i) fixed for a given configuration of the logic tile array, programmable/configurable logic circuitry and/or FPGA or (ii) re-configurable or re-programmable in situ or during (normal) operation of the FPGA. In addition thereto, or in lieu thereof, in one embodiment, at least one of the logic tiles of the array of logic tiles is in the powered-on state (regardless of the power state or status of the other logic tiles) and, as such, receives electrical power during operation of the FPGA (regardless of the power state of the other logic tiles). Here, the power state or status (i.e., powered-up or powered-down) of that at least one logic tile is not configurable or programmable (for example, by the user).

The control circuitry (for example, of the FPGA (which is external to the array of logic tiles)) may, for example, at power-up or start-up, or during initialization or re-initialization and/or during configuration of the logic tiles, instruct, program, configure or enable circuitry to (i) provide electrical power to selected logic tiles comprising a first subset of the array (wherein such logic tiles are powered-up or powered-on) and (ii) not provide power to or enable consumption of power by a selected second subset of the array (wherein such logic tiles are powered-down or powered-off). In one embodiment, such control circuitry controls power-on/power-off circuitry in one or more logic tiles to responsively engage, enable or connect electrical power to logic tile(s) and/or enable consumption of electrical power by circuitry in the logic tile(s). As noted above, such power-on/power-off circuitry may be disposed in the logic tiles or external thereto (for example, circuitry centrally located at the power generation/distribution circuitry for the logic tiles).

As such, in one embodiment, during, for example, configuration of the array of logic tiles, control circuitry configures each of the logic tiles in powered-up/powered-down state via control of the power-on/power-off circuitry in each of the logic tiles. In this embodiment, while the power is available to all of the logic tiles of the array, the power-on/power-off circuitry of only those logic tiles of the array that are configured to a powered-up state connect electrical power to the associated logic tile (wherein such logic tile is powered-up or powered-on). Notably, this embodiment may also include logic tiles that are configured in a partial powered-down state.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIGS. 2A-2J illustrate, in block diagram form, exemplary embodiments of a physical array of a plurality of logic tiles of programmable/configurable logic circuitry of an FPGA wherein, in normal operation of the FPGA, (i) one or more of the logic tiles are partially powered-down (i.e., a portion of the circuitry of the logic tile receives electrical power (for example, a certain portion of the I/O circuitry to, e.g., output or provide a known or fixed data state to external circuitry or interconnect network of one or more other logic tiles of the plurality of logic tiles connected thereto) and a portion of the circuitry does not) and/or one or more of the other logic tiles are completely powered-down (none of the circuitry of the logic tile receives electrical power; that is, no electrical power is provided or applied to, consumed or generated by and/or distributed within the logic tile) and (ii) one or more logic tiles are powered-up (i.e., electrical power is provided or applied to and/or consumed, received or generated by the logic tile); notably, the logic tiles illustrated in a "hashed patterned fill" indicate those logic tiles that are powered-up, and the logic tiles that do not include a hashed patterned fill are configured or programmed to be partially or completely powered-down in or during operation of the FPGA (for at least that configuration of the array of logic tiles) (see the Key inset in FIG. 2A, which is also applicable to the other configurations or embodiments of FIGS. 2B-2J as well as FIGS. 4A and 4B); in one embodiment, the power state of Logic Tile X is not programmable or configurable (i.e., the logic tile is always powered-up or powered-on; that is, maintained in a powered-up or powered-on state); it should be noted that all permutations and combinations of the number of powered-up and powered-down logic tiles, spatial relationship of the powered-up and powered-down logic tiles, and locations thereof within the array (i.e., on a perimeter or in the interior), are intended to fall within the scope of the inventions; notably, the logic tiles that are powered down may or may not have portions of circuitry powered up to conduct I/O signals to/from the logic tiles that remains powered-up, and the I/O signals may traverse in horizontal, vertical, and/or diagonal directions (see, for example, FIGS. 5A and 5B);

Figure 1A:
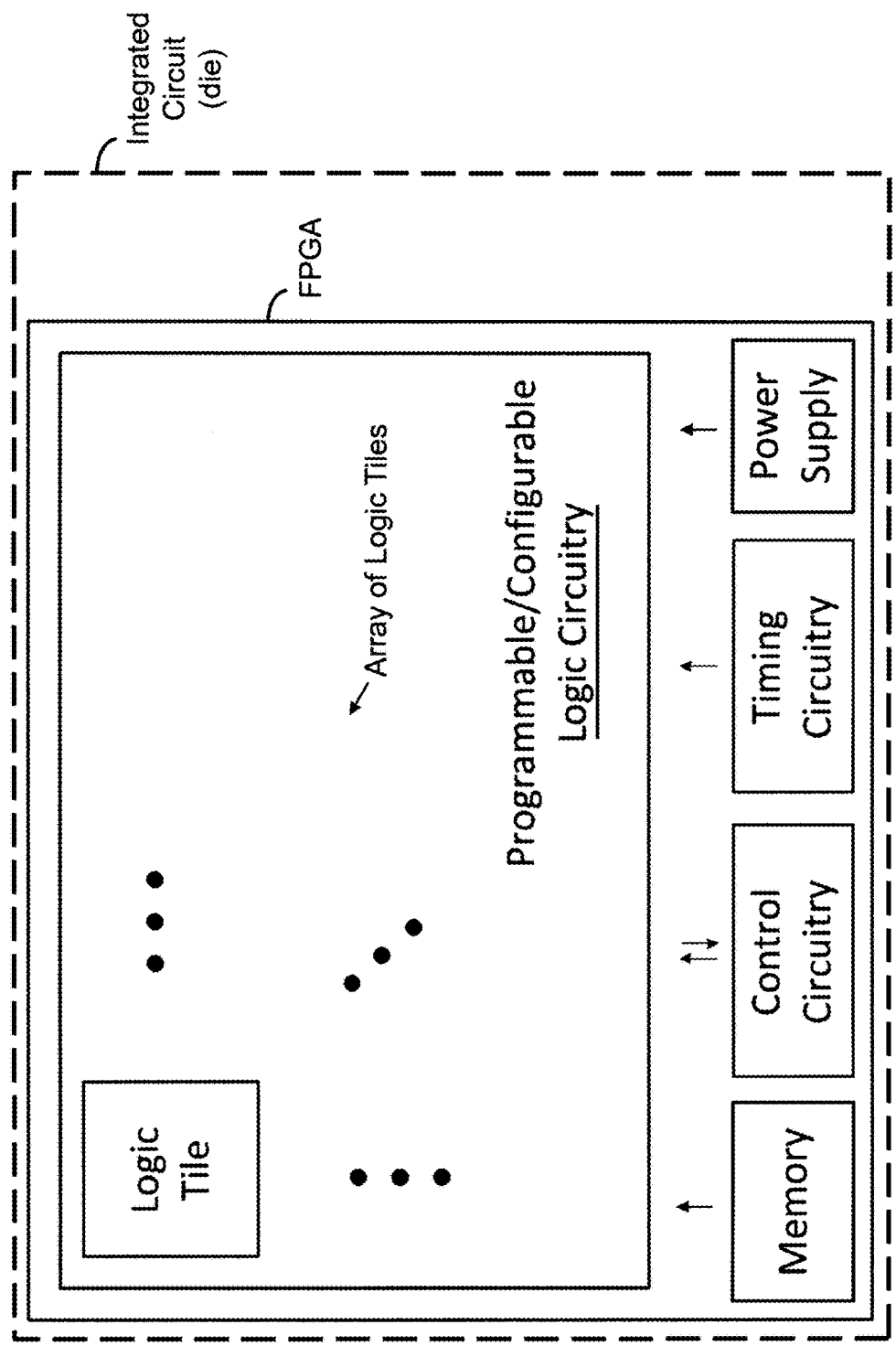
FIG. 1A illustrates a block diagram representation of, for example, an exemplary integrated circuit including control circuitry, timing or clock circuitry, power supply circuitry and programmable/configurable logic circuitry (which includes a plurality of logic tiles, each of which may include transistors configured to perform combinational and/or sequential functions (simple and/or complex) and transistors (that may be interconnected, for example, as multiplexers having two or more inputs which are electrically interconnected into a network (see, for example, the interconnect networks described and/or illustrated in U.S. Pat. No. 9,503,092, which are incorporated herein by reference) as well as connected to, for example, associated data storage elements, input pins and/or lookup tables that, when programmed, determine the operation of the multiplexers))

Again, there are many inventions described and illustrated herein. An embodiment or implementation described herein as "exemplary" is not to be construed as ideal, preferred or advantageous, relative to other embodiments or implementations; rather, it is intended reflect or indicate the embodiment(s) is/are "example" or "illustrative" embodiment(s). Indeed, these inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations/permutations are not discussed separately herein.

DETAILED DESCRIPTION

In a first aspect, the present inventions relate to an integrated circuit including an FPGA disposed therein wherein the FPGA includes programmable/configurable logic circuitry having a plurality of logic tiles (which may be arranged in an array of row(s) and column(s)) and wherein one or more (or all) logic tiles may be selectively programmed or configured in a powered-up state or a powered-down state. In one embodiment, the FPGA includes programmable or configurable power-on/power-off circuitry to responsively control the power state of one or more (or all) of the logic tiles associated with such power-on/power-off circuitry. For example, in one embodiment, power-on/power-off circuitry is disposed in each of the logic tiles. Control circuitry may program, configure and/or control the power state of the logic tile via control of the power-on/power-off circuitry associated with the tile. That is, in one embodiment, control circuitry may establish the power state or status of the logic tile by programming or configuring power-on/power-off circuitry to partially or completely control, remove and/or terminate electrical power provided or applied to and/or consumed or generated by one or more of the logic tiles of the logic tile array.

Thus, the power state of one or more of the logic tiles may be partially powered-down during normal operation of the FPGA (i.e., a portion of the circuitry of the logic tile receives electrical power (e.g., circuitry in the output paths of the I/O and/or memory cells associated with the interconnect network) and a second portion (e.g., the remaining portion) of the circuitry in the one or more logic tiles does not—for example, multiplexers of the interconnect network and/or the logic circuitry that is configurable (in operation) to perform combinational and/or sequential operations) and/or the power state of one or more of the other logic tiles may be completely powered-down during normal operation of the FPGA (i.e., none of the circuitry of the logic tile receives current or electrical power; that is, no electrical power is provided or applied to and/or consumed or generated by the logic tile). Notably, normal operation of the FPGA does not include the process of configuring or re-configuring the FPGA, including configuring and/or re-configuring one or more (or all) of the logic tiles of the FPGA.

In one embodiment, the power-on/power-off circuitry is entirely or partially disposed in the logic tile associated therewith. For example, the power-on/power-off circuitry may be one or more switches, located at the electrical power interface of the associated logic tile, that responsively connect or disconnect the associated logic tile to/from electrical power (for example, a power supply or regulator of the logic tile or integrated circuit and/or a power conductor or plane of the integrated circuit). In another embodiment, the power-on/power-off circuitry is a circuit disposed in the local power generation circuitry of the logic tile which enables/disables generation or distribution of electrical power to or within the logic tile. Regardless, control circuitry may control or determine the power state of one or more (or all) of the logic tiles via control of the power-on/power-off circuitry associated with such one or more logic tiles.

In another embodiment, the power-on/power-off circuitry is disposed entirely external to the logic tile. For example, the power-on/power-off circuitry may be located adjacent to one or more primary power supplies which provide power to the array of logic tiles and/or the associated logic tile. In one embodiment, the power supply, which generates or regulates electrical power for the FPGA, may include power-on/power-off circuitry which responsively determines which logic tiles of the array of logic tiles are provided/consume or are not provided/consume electrical power. In this embodiment, control circuitry, for example, disposed on the integrated circuit but external to the array of logic tiles of the programmable/configurable logic circuitry, determines or control whether one or more logic tile is/are provided or receives/consumes electrical power from other circuitry on the integrated circuit (e.g., the "central" power supply or power regulator).

The power state of the logic tiles of the array of logic tiles may be configurable on an individual logic tile basis. For example, the control circuitry may individually control, program or configure the power-up/power-down circuitry (e.g., one or more switches) of one or more logic tiles to individually and separately establish a power state of such logic tiles—for example, determine whether a logic tile (or group of logic tiles) receives power from, for example, a power supply or regulator and/or a power plane of the integrated circuit. In another embodiment, the power state of a plurality of logic tiles (for example, a plurality of contiguous logic tiles) of the array is programmable or controllable on a group/block of logic tiles basis. Indeed, in one embodiment, control circuitry may control, program or configure the power state (i.e., powered-up or powered-down) for a predetermined plurality of logic tiles is determined as a group or together—for example, the power state of a virtual array of logic tiles may be established as a group or block of logic tiles. (See, the discussion of virtual arrays of logic tiles in U.S. Provisional Patent Application 62/511, 739 and U.S. patent application Ser. No. 15/975,037, which are hereby incorporated by reference).

In one embodiment, control circuitry may configure, program or control the power states of the logic tiles, for example, at power-up or start-up, or during initialization or re-initialization, and/or in response to reset or the like sequence/operation (which may be before, during/concurrently or after configuration of the logic tiles of the array of logic tiles). The power state of the logic tiles thereafter may be fixed for a given configuration of the logic tiles of the FPGA or may be re-configurable or re-programmable during (normal) operation of the FPGA. In addition thereto, or in lieu thereof, in one embodiment, at least one of the logic tiles of the plurality or array of logic tiles is always in the powered-on state and, as such, receives electrical power during operation of the FPGA regardless of the status of the power state of other logic tiles. In this embodiment, the power state of the at least one logic tile is not configurable or programmable (for example, by the user).

For example, in one embodiment, control circuitry (for example, of the FPGA (which is external to the array of logic tiles)) may, for example, at power-up or start-up, or during initialization or re-initialization and/or during configuration of the logic tiles, instruct, program, configure or enable circuitry to (i) provide electrical power to selected logic tiles comprising a first subset of the array (wherein such logic tiles are powered-up or powered-on) and (ii) not provide power to a selected second subset of the array (wherein such logic tiles are powered-down or powered-off). In one embodiment, the control circuitry programs, configure or controls power-on/power-off circuitry (e.g., switches) in one or more logic tiles to responsively engage, enable or connect electrical power to logic tile(s) or disable/enable consumption of electrical power by logic tile(s). As noted above, such power-on/power-off circuitry may be disposed in the logic tiles, at the electrical power interface of the logic tiles and/or external thereto (for example, circuitry centrally located at the power generation/distribution circuitry for the logic tiles).

As such, in one embodiment, during, for example, configuration of the array of logic tiles, control circuitry configures each of the logic tiles in powered-up/powered-down state via control of the power-on/power-off circuitry in each of the logic tiles. In this embodiment, while the power is available to all of the logic tiles of the array, the power-on/power-off circuitry of only those logic tiles of the array that are configured to a powered-up state receive and/or connect electrical power to the associated logic tile (wherein such logic tile is powered-up or powered-on). Notably, as intimated above, the logic tiles may also be configured or programmed in a partial powered-down state.

Figure 1B:
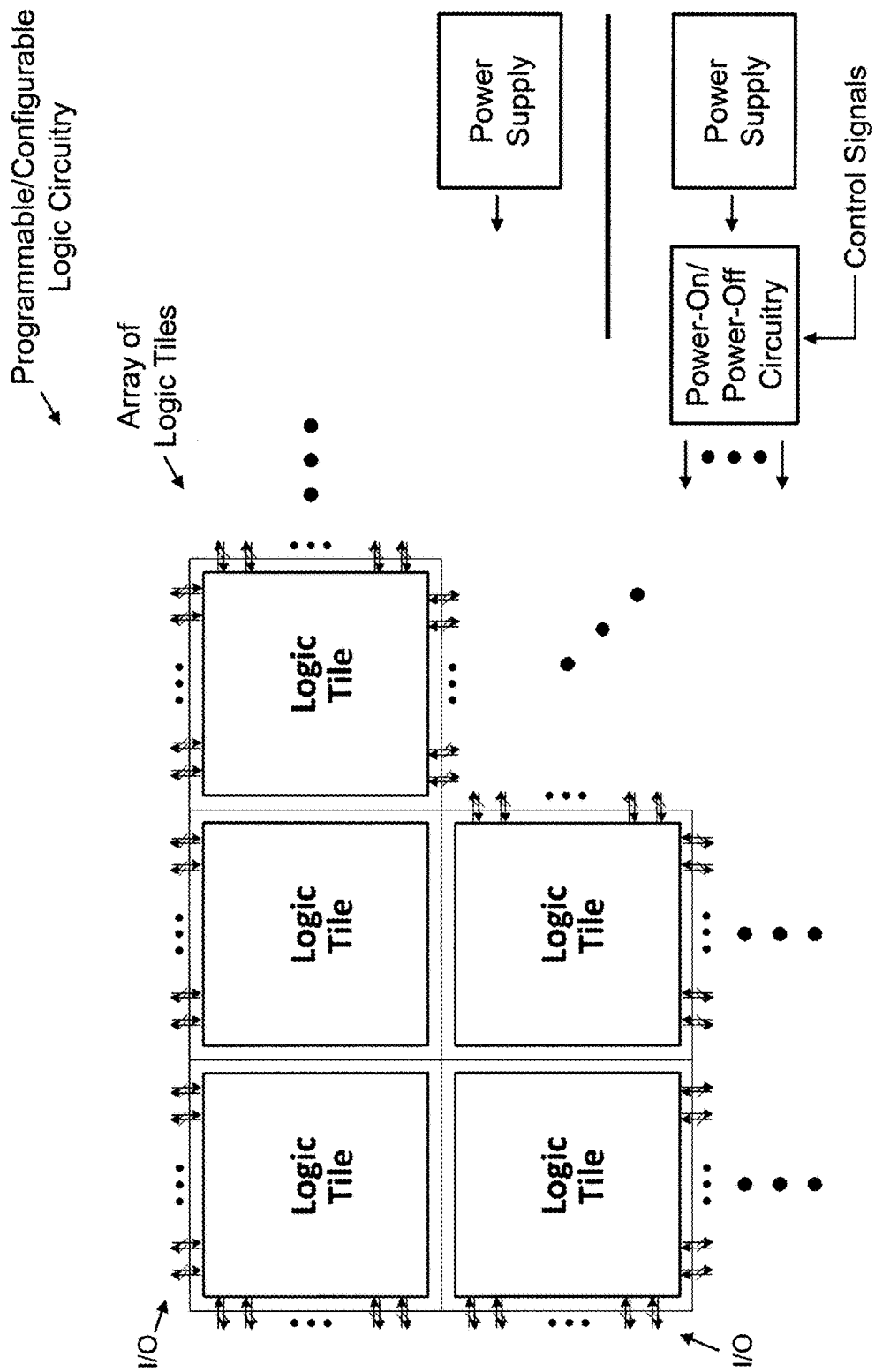
FIG. 1B illustrates, among other things, a block diagram representation of a physical array of a plurality of logic tiles of, for example, an exemplary FPGA, wherein input/output of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (for example, a hierarchical network and/or mesh network); notably, in these illustrative embodiments, electrical power may be provided to the array of logic tiles via a power supply and/or through power-on/power-off circuitry that is maintained, programmable or configurable via one or more control signals from, for example, the control circuitry; in one embodiment, such power-on/power-off circuitry may be located in the logic tile, at the electrical power interface therewith, and/or adjacent to one or more primary power supplies which provide power to the array of logic tiles.
Figure 1C:
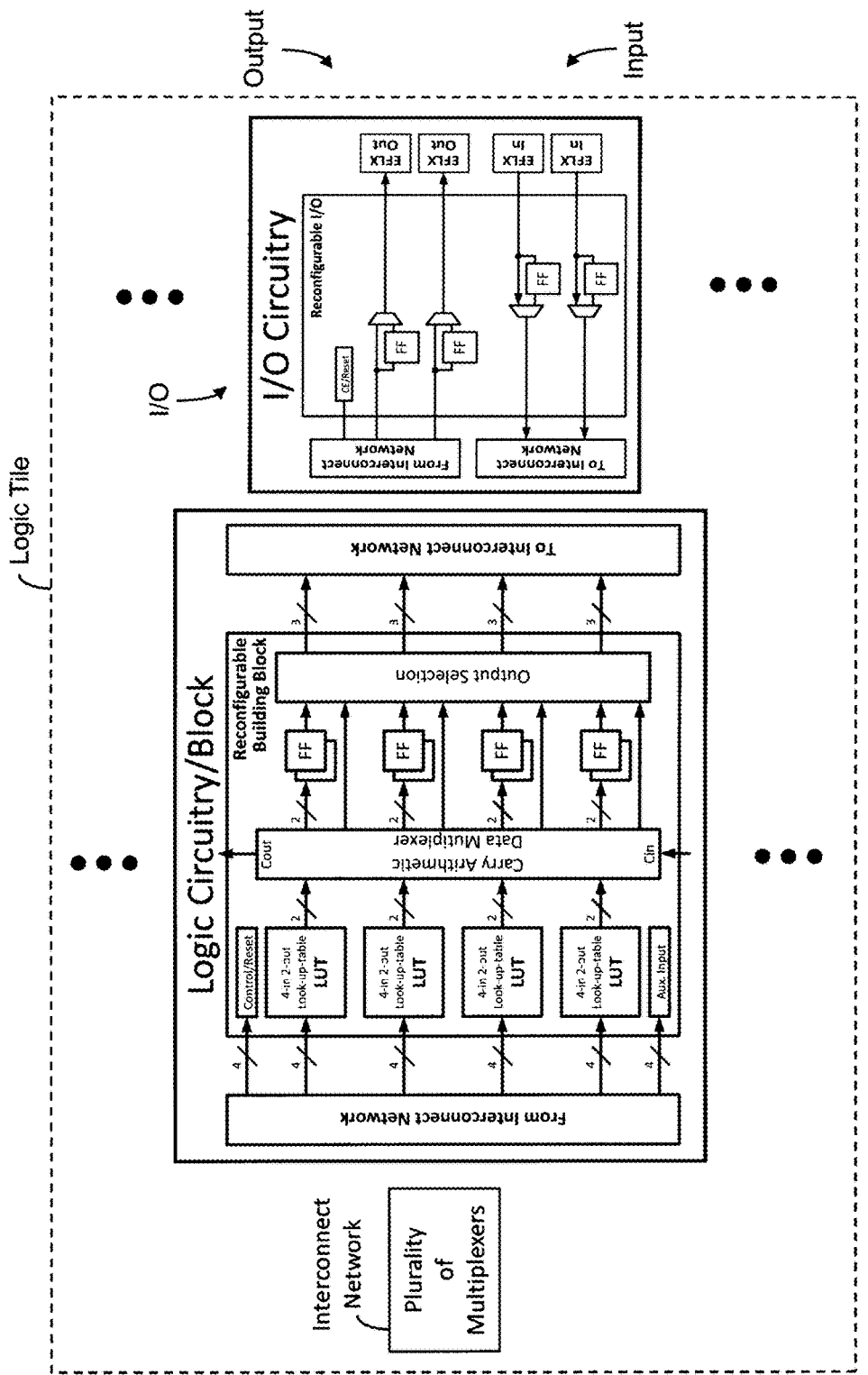
FIG. 1C illustrates a block diagram representation of a portion of an exemplary logic tile of the programmable/configurable logic circuitry of FIGS. 1A and 1B, wherein the logic tile includes logic and I/O, for example, a plurality of (i) logic blocks, each logic block including, for example, a plurality of look-up-tables, arithmetic blocks, data multiplexers, flip-flops, and control/reset circuitries, (ii) I/O (I/O circuitry or blocks, which are disposed on the periphery, perimeter or edge of the logic tile, to facilitate interconnection between circuitry of the logic tile and circuitry external to the tile (and, in one embodiment, external to the logic tile array of the programmable/configurable logic) and (iii) an interconnect network composed of one or more multiplexers or switches which may be arranged or configured into an interconnect network having a plurality of switch matrices (or stages of switch matrices) to, for example, facilitate communication between the logic tiles and/or performance of logic operation in or during normal operation of the currently configured integrated circuit; notably, the I/O (e.g., the physical points of entry/exit of the signals to the logic tile—all forms of which are intended to fall within the scope of the present invention) may be disposed along the perimeter, periphery or border of the logic tile (e.g., where the logic tile has a square or rectangle shape, on all four sides—see FIGS. 1B and 1D); notably, I/O means one input/output (which may be uni-directional conductor and/or bi-directional conductor) and/or a plurality of inputs/outputs (i.e., more than one uni-directional conductor and/or more than one bi-directional conductor)
Figure 1D:
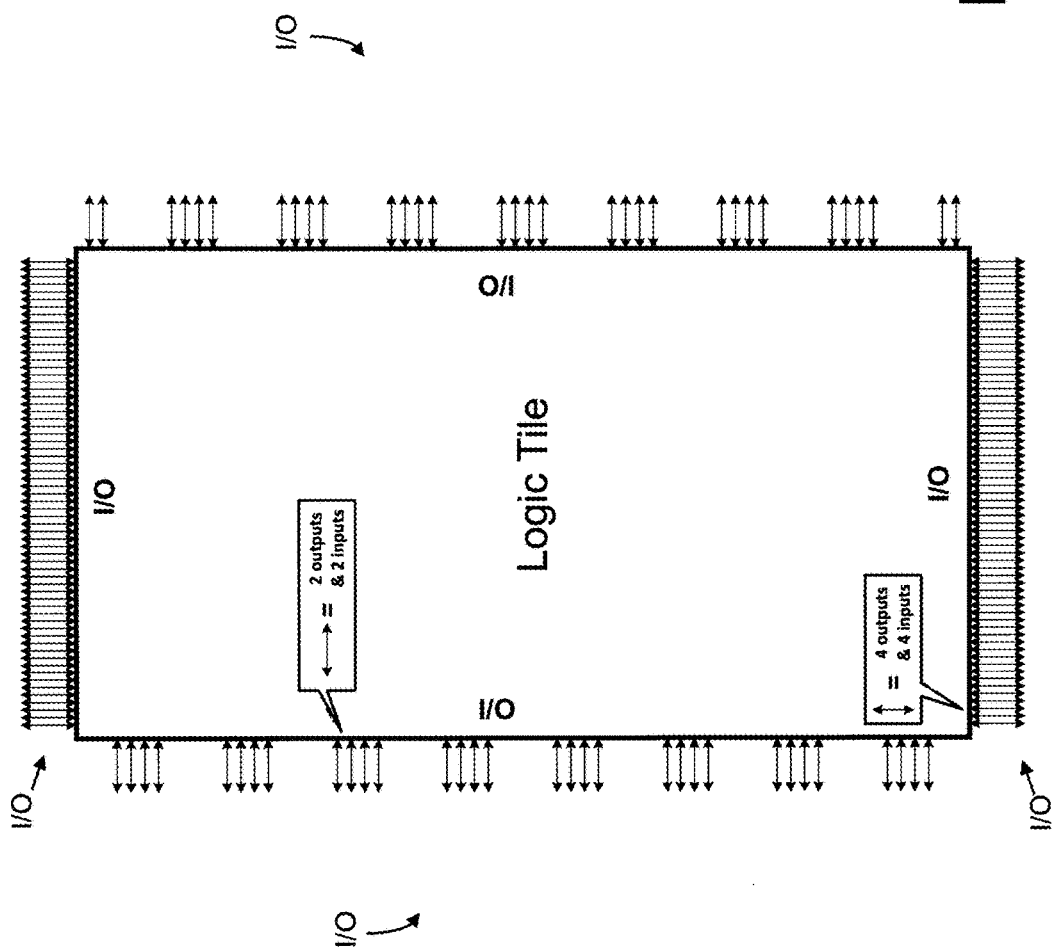
FIG. 1D illustrates a block diagram representation of an exemplary logic tile of the programmable/configurable logic circuitry of FIGS. 1A-1C wherein I/O of the logic tile (which, in one embodiment, are electrically coupled to I/O circuitry or blocks) in this exemplary embodiment are located on all sides of the rectangular-shaped logic tile (i.e., interspersed along the entire perimeter of the logic tile); each of the logic tiles of the physical array have a common layout of the I/O on the perimeter or periphery of the logic tile; notably, the I/O illustrated herein are separate from or independent of the interconnect I/O of the logic tile—which is employed for internal connection to the interconnect network within the logic tile and/or between logic tiles of the physical array of the programmable/configurable logic circuitry (see, for example, U.S. Pat. No. 9,906,225)

With reference to FIGS. 1A and 1B, the integrated circuit includes an FPGA which includes, among other things, programmable/configurable logic circuitry which includes a plurality of logic tiles (e.g., arranged in an array of row(s) and column(s) wherein one or more (or all) of the logic tiles are configurable to a powered-up state or a powered-down state. Each logic tile typically includes thousands of transistors which may be configured to perform combinational and/or sequential functions (simple and/or complex). In one embodiment, each logic tile may include one or more multiplexers or switches which may be arranged in a plurality of switch matrix or switch matrices stages of an interconnect network, to, for example, perform logic operations in or during normal operation of the integrated circuit (based on that current configuration of the logic block(s)) and (ii) I/O (I/O pins and associated I/O circuitry or blocks)—for example, I/O pins, disposed on the periphery, perimeter or edge of the logic tile, and I/O circuitry or blocks associated with such I/O pins, to facilitate interconnection between circuitry of the logic tile and circuitry external to the programmable/configurable logic circuitry. (See, e.g., FIG. 1C). Notably, in one embodiment, the I/O (I/O pins and associated I/O circuitry/blocks) of each logic tile are commonly interspersed along the entire perimeter or border of the logic tile—for example, in those situations where the logic tile has a square or rectangle shape, on all four sides. (See, e.g., FIG. 1D). Thus, in one embodiment, each logic tile of the logic tile array has a common I/O layout on the perimeter of the logic tile (which advantageously facilitates the tiling of the logic tiles of the physical array).

The FPGA of the integrated circuit also includes control circuitry and a power supply. In one embodiment, the control circuitry, at power-up, at start-up, during initialization or re-initialization and/or during configuration of the logic tiles, configures or programs the plurality or array of logic tiles (for example, configures the interconnect network of the logic tiles) and, in addition, selectively configures or programs one or more (or all) logic tiles of the array in a powered-down state. For example, in one embodiment, the control circuitry applies control signals to power-on/power-off circuitry to selectively control, configure or program the power state of the associated logic tiles.

Figure 2B:
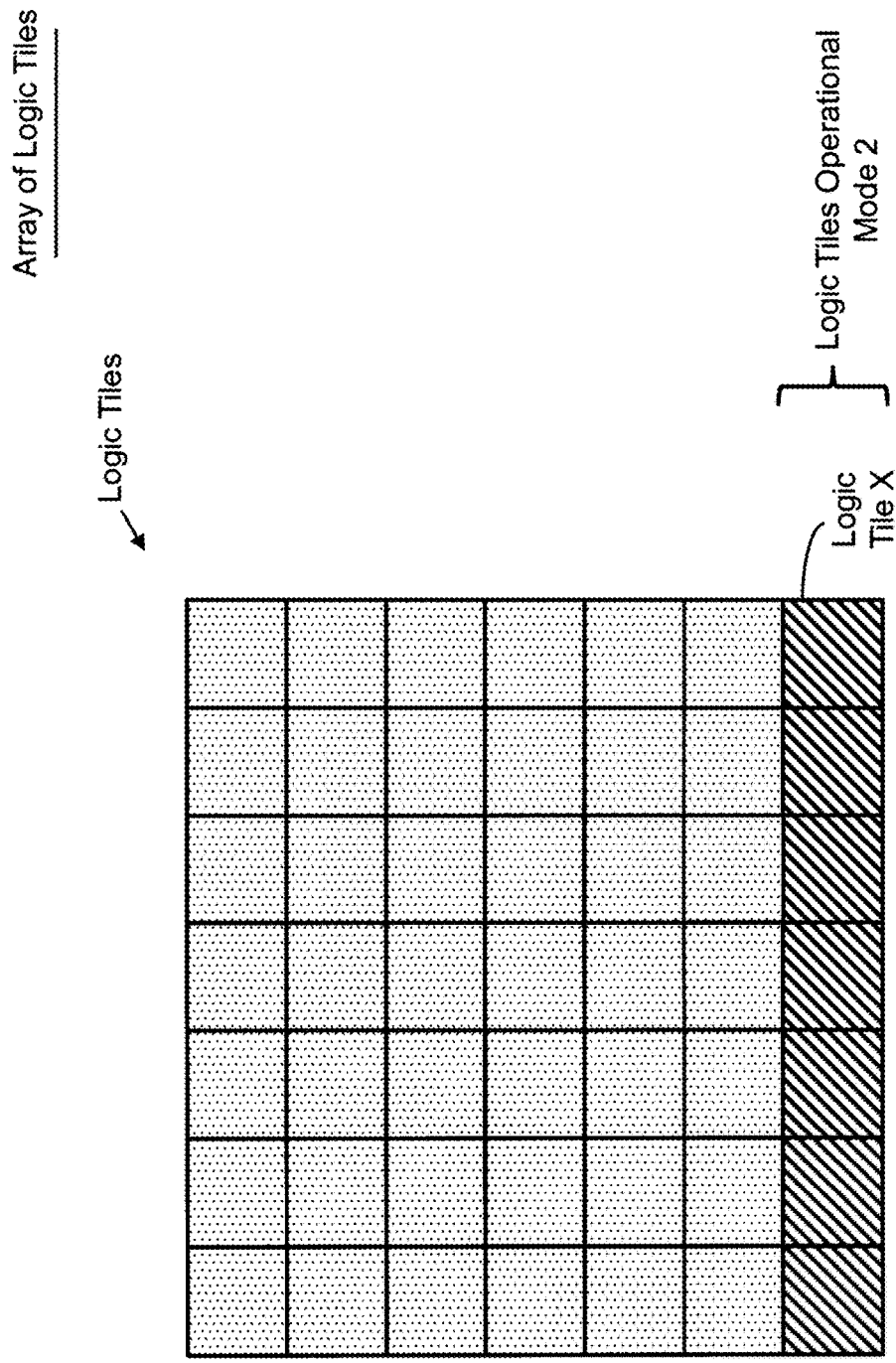
Figure 2C:
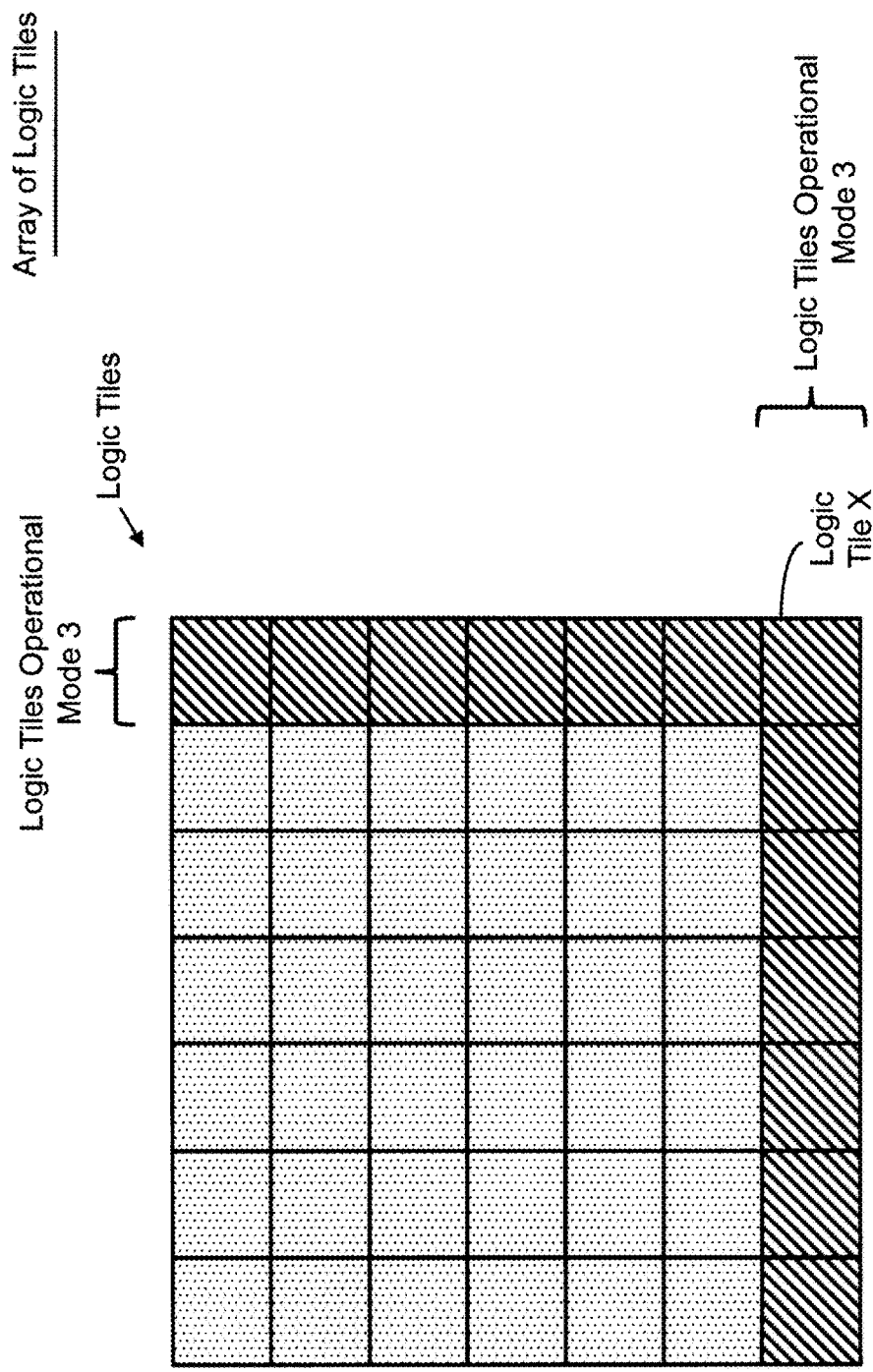
Figure 2D:
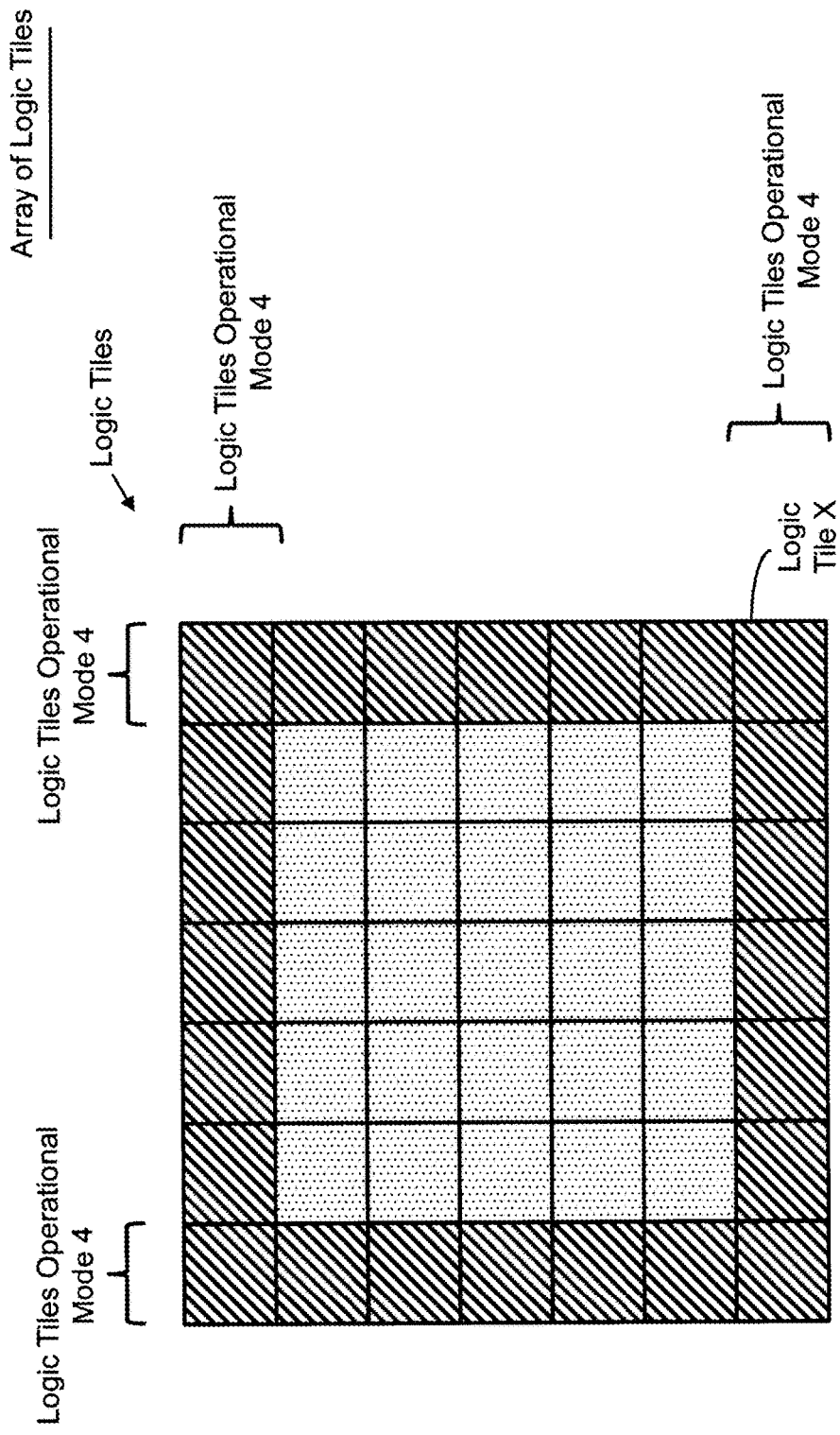

The control circuitry may selectively configure the plurality or array of logic tiles in a particular power state based on the operational mode of the logic tiles. For example, with reference to FIGS. 2A-2J, depending on the operational mode of the logic tiles during normal operation of the FPGA, certain logic tiles are in a powered-up state and certain other logic tiles are in a powered-down state. Notably, those logic tiles having a hashed patterned fill indicate those logic tiles that are powered-up, and the logic tiles that do not include a hashed patterned fill are configured or programmed to be partially or completely powered-down in or during operation of the FPGA (for at least that configuration of the array of logic tiles). A "Key" is set forth in FIG. 2A—which is applicable to all of the embodiments illustrated in FIGS. 2A-2J.

With continued reference to FIGS. 2A-2J, in one embodiment, the array of logic tiles includes at least one logic tile that is always or maintained in a powered-up or powered-on state (regardless of the power status of the other logic tiles). In these illustrative embodiments, the power state of Logic Tile X is not programmable or configurable (i.e., the logic tile is powered-up or powered-on regardless of the power state configuration of the other logic tiles of the array). In one embodiment, the operational logic tiles are disposed on the edge of the array (see, for example, FIGS. 2B-2D). Here, the logic tiles configured in a powered-up state are located or disposed on one or more (or all) sides or perimeters of the array. In these embodiments, the I/O connections to/from the array may be located on one or more of the perimeters of the logic tile array. Here, one or more logic tiles disposed on one or more corners, edges, sides or perimeters of the array are in at least a partial powered-up or powered-on state wherein power is provided to the I/O connections in these tiles, thereby facilitating or enabling the array to communicate (via such I/O connections) with other circuitry the integrated circuits and/or external thereto.

Notably, in many embodiments, the location of the critical I/O connections, for example, of a certain operational mode, may require those tiles responsible for or associated with these I/O connections to be powered on during such operational mode. For example, with reference to the array in FIG. 2A, it may be important for the I/O connections on the lower-right-hand corner to receive power, thus requiring Logic Tile X to remain powered-on during such operational mode; in addition, with reference to the array in FIG. 2D, it may be important for the I/O connections be active or powered-up (and thereby receive power) in/on all four perimeters of the array in Logic Tile Operational Mode 4, thus requiring Logic Tile X on one or more or all four corners and/or sides to remain powered-on during such operational mode.

Figure 2E:
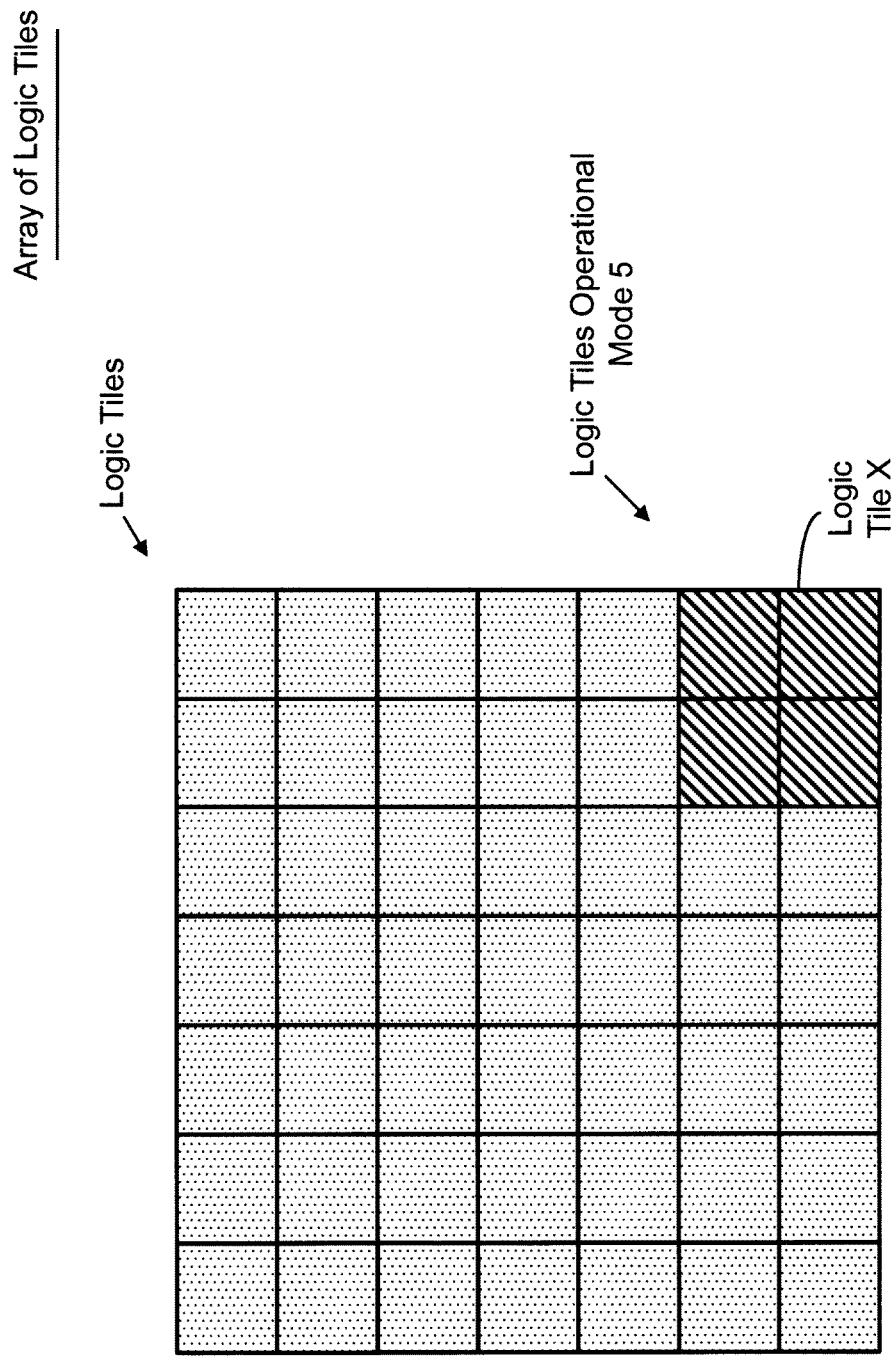
Figure 2F:
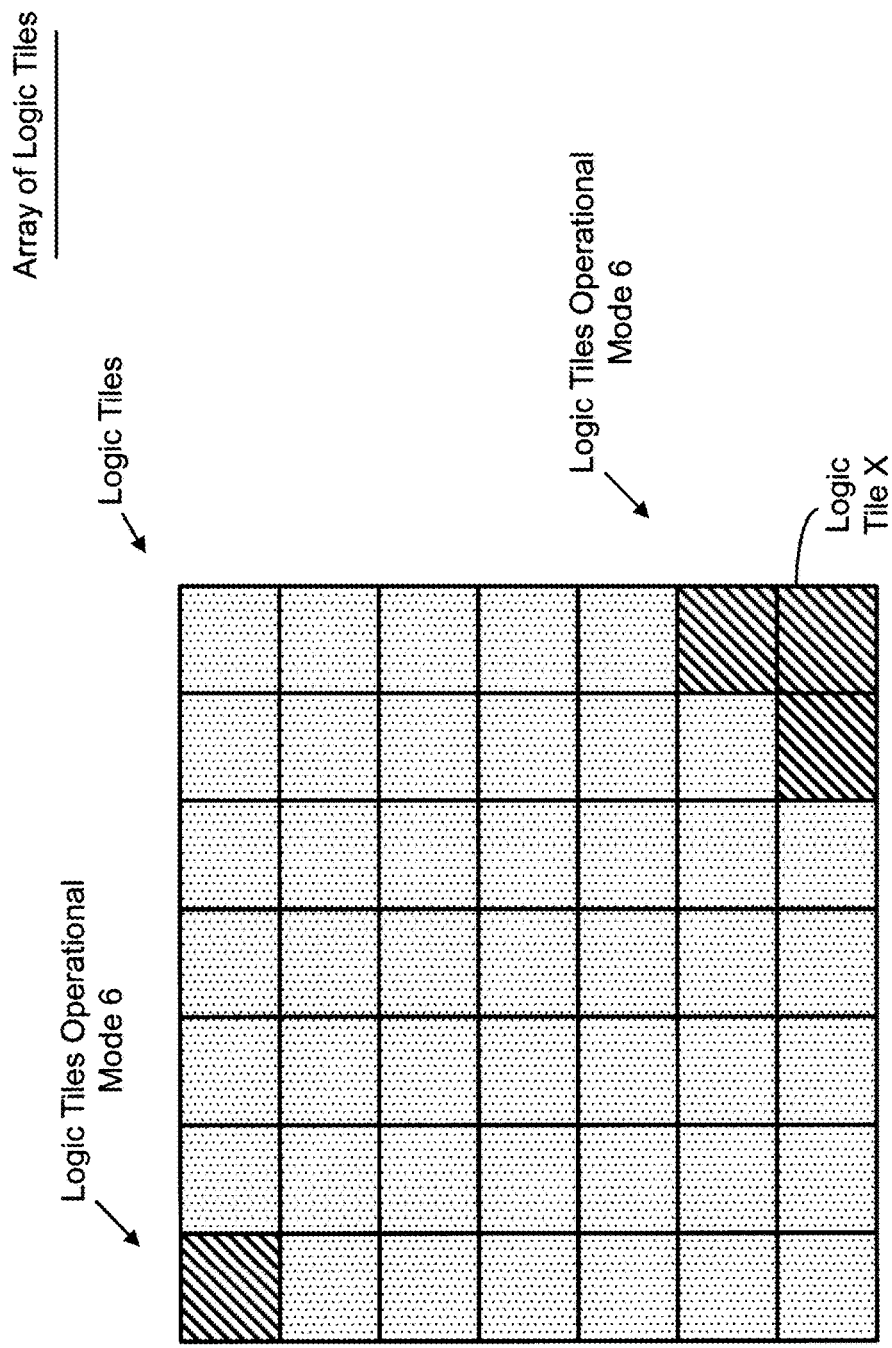
Figure 2G:
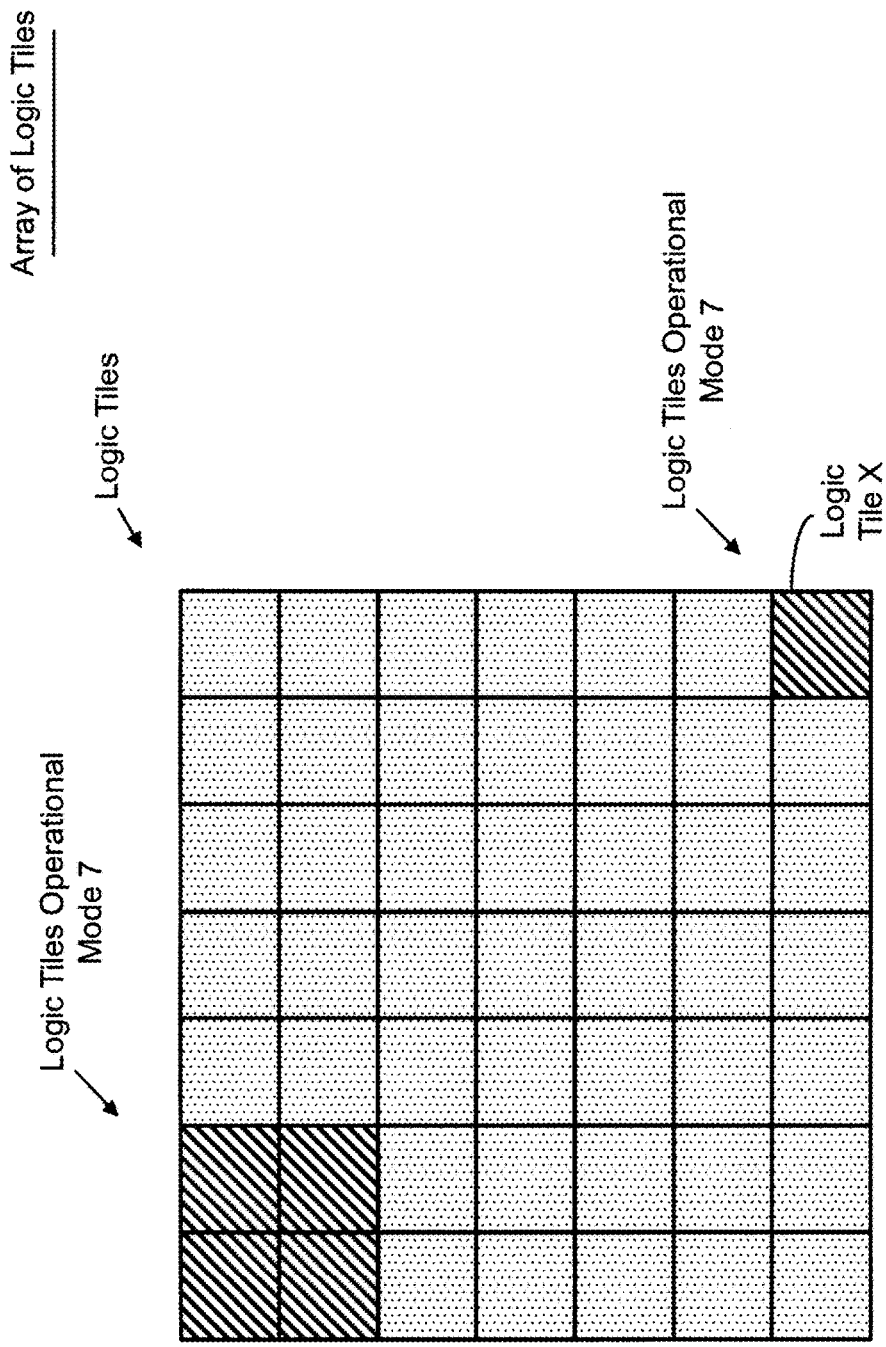
Figure 2H:
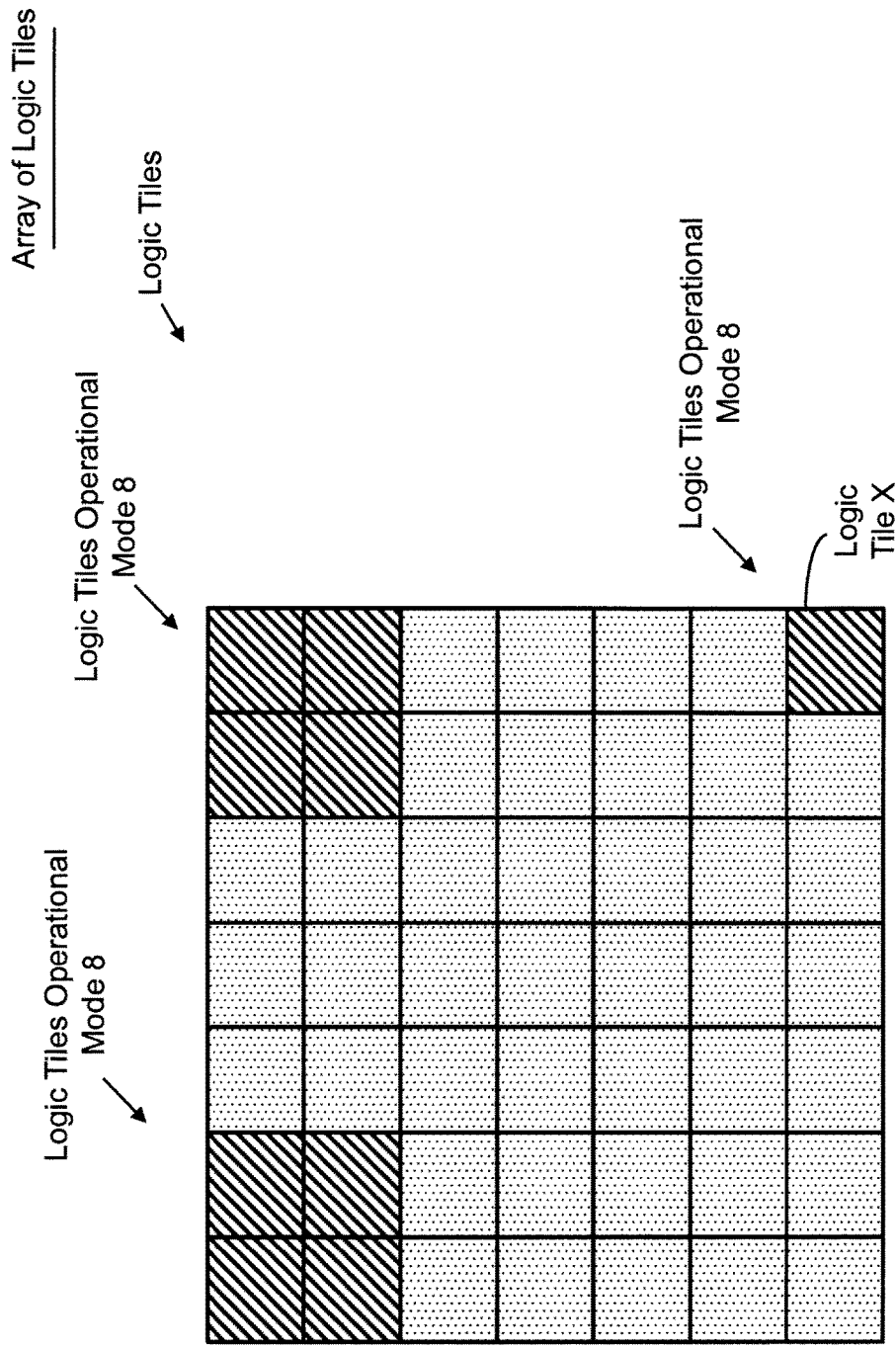
Figure 21:
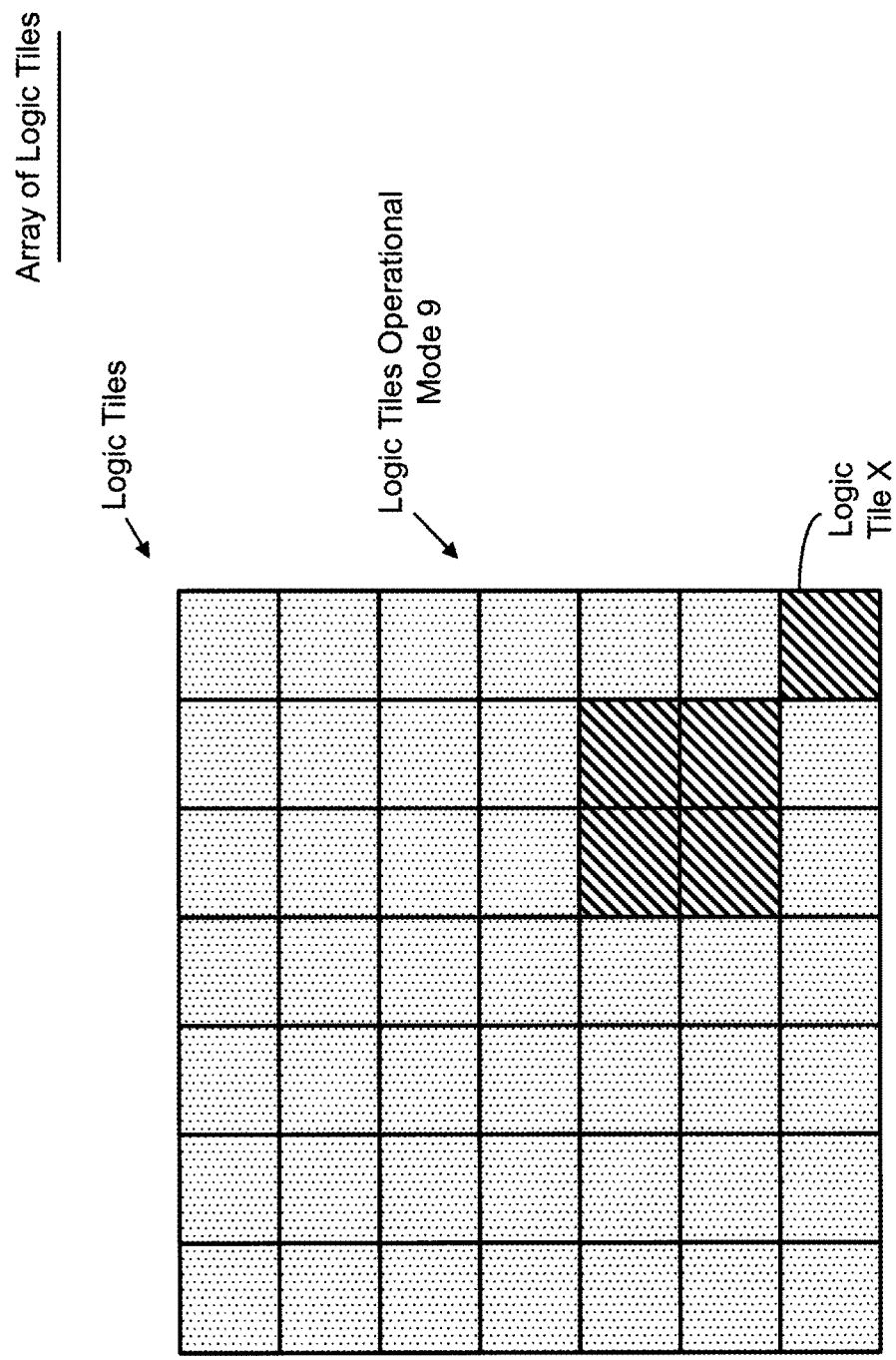
Figure 2J:
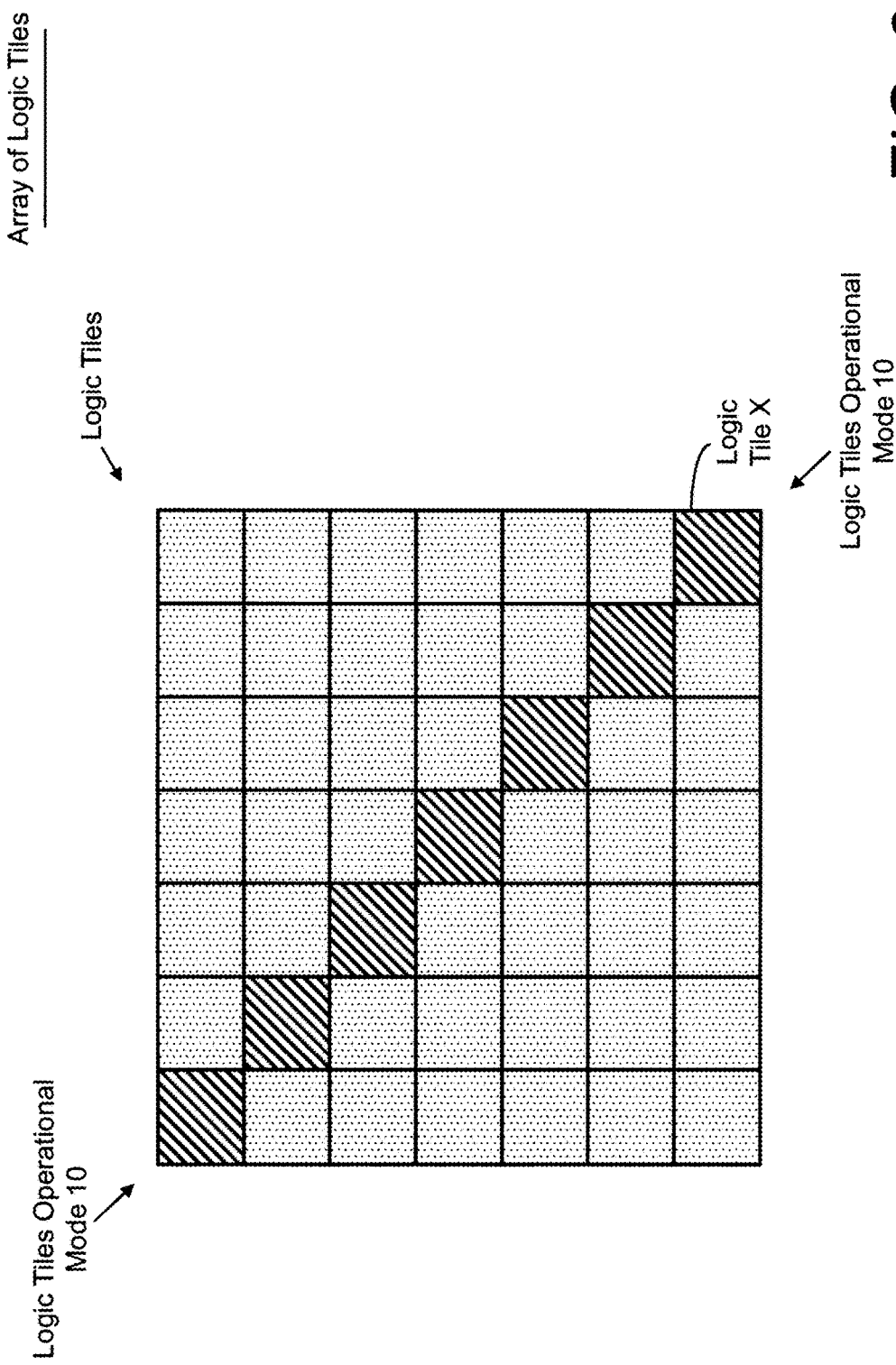

The operational (or powered-up) logic tiles may be contiguous and/or non-contiguous (see, for example, FIGS. 2E-2G). Such contiguous and/or non-contiguous logic tiles may be located on a perimeter of the array or located in an interior of the array (see, for example, FIGS. 2H and 2I). Indeed, in one operation configuration, the logic tiles are contiguous and include both perimeter and interior tiles (see, for example, FIG. 2J).

Figure 3A:
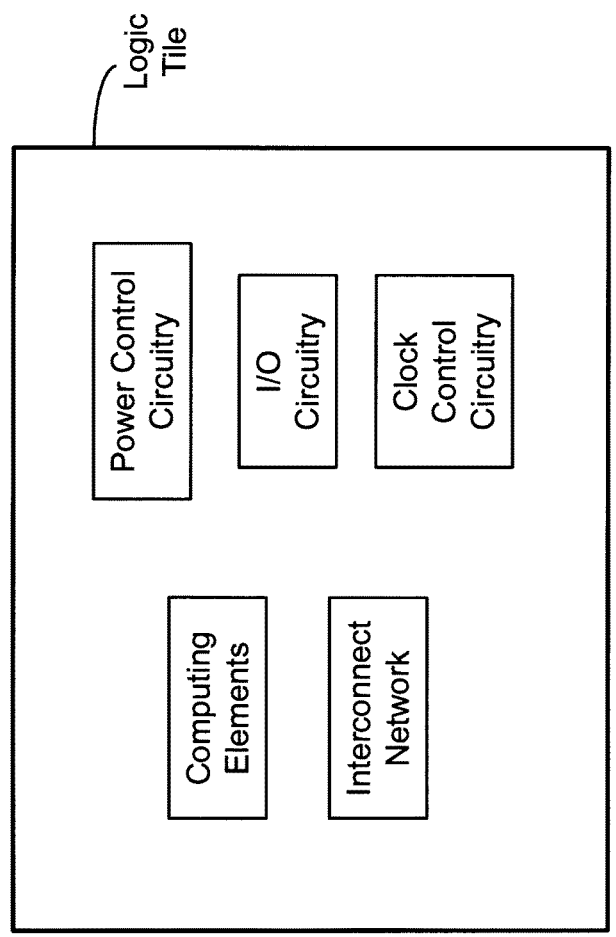
FIGS. 3A and 3B illustrate, in a block diagram form, exemplary embodiments of a logic tile of the array of logic tiles wherein the logic tile includes computing elements, an interconnect network (for example, a configurable or re-configurable interconnect network), clock control circuitry (which may include clock distribution and transmission circuitry), I/O circuitry to interface and/or communicate with circuitry external to the logic tile (for example, a neighboring logic tile, circuitry that is external to the array of logic tiles, and/or memory that is disposed in the logic tile array (see, for example, U.S. Patent Application Publication 2017/0063378), and power control circuitry (FIG. 3A) or power-on/power-off circuitry (FIG. 3B); notably, the logic tiles may include local power supply generation circuitry (not illustrated) using the power supplied throughout the integrated circuit wherein such circuitry may be controlled to generate or not generate electrical power.
Figure 3B:
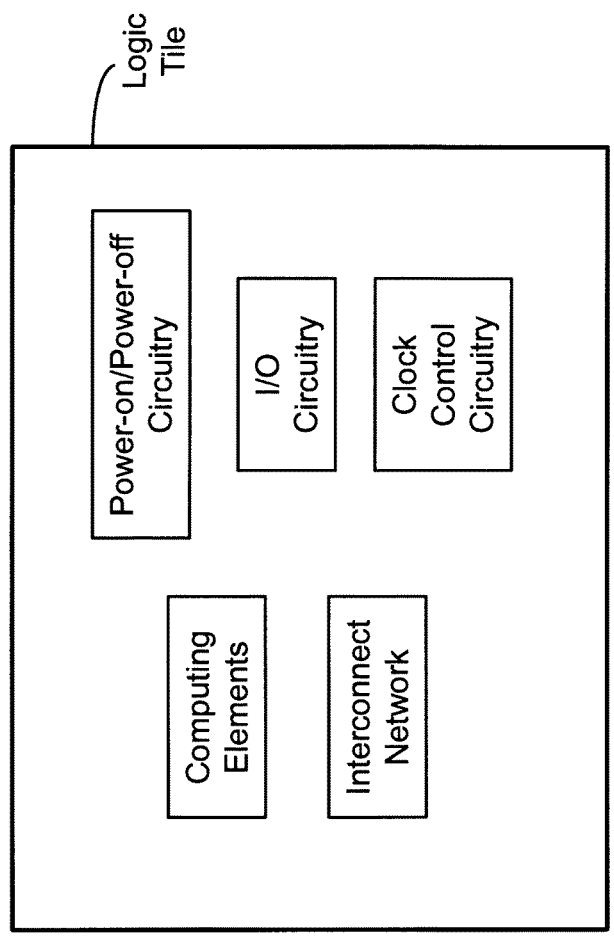

With reference to FIGS. 3A and 3B, in one embodiment, each of the logic tiles include power control circuitry and/or power-on/power-off circuitry to enable or implement the configurable or programmable power state of the logic tiles. Here, control circuitry may control or determine the power state of one or more (or all) of the logic tiles via control of the power control circuitry and/or power-on/power-off circuitry associated with one or more logic tiles. For example, in one embodiment, control circuitry may establish the power state of the logic tile by programming or configuring power-on/power-off circuitry to partially or completely control, remove and/or terminate electrical power provided or applied to and/or consumed or generated by one or more of the logic tiles of the logic tile array.

With continued reference to FIGS. 3A and 3B, in the illustrative embodiments, the logic tiles of the array may also include computing elements, an interconnect network (for example, a configurable or re-configurable interconnect network), clock control circuitry (which may include clock distribution and transmission circuitry), I/O circuitry to interface and/or communicate with circuitry external to the logic tile (for example, a neighboring logic tile, circuitry that is external to the array of logic tiles, and/or memory that is disposed in the logic tile array (see, for example, U.S. Patent Application Publication 2017/0063378). In one embodiment, the logic tiles may include local power supply generation circuitry (not illustrated) using the power supplied throughout the integrated circuit wherein such circuitry may be controlled (via the control circuitry) to generate or not generate electrical power and, in turn, responsively establish the power state of the logic tile.

As intimated above, it may be advantageous to maintain the data state on data paths of one or more (or all) of the logic tiles that is/are programmed or configured in a powered-down state in a known data state. For example, in those embodiment where one of logic tiles that is configured or programmed in a fully or partially powered-down state is located on the perimeter of the array (e.g., where the I/O of such logic tiles are connected to circuitry external to the programmable/configurable logic circuitry and/or the FPGA), it may be advantageous that the integrated circuit (e.g., the FPGA) include circuitry to hold, store and output a known data state (e.g., a fixed defined/known data state) on the I/O of such fully or partially powered-down logic tile. For example, with reference to FIGS. 3C-3E, in one embodiment, output power-down circuitry is coupled to/in the I/O circuitry of the FPGA and/or one or more (or all) of the logic tiles, to maintain, latch and/or store (and make available at the output(s)) a known, defined and/or fixed data state on the associated I/O. In this way, the I/O of the fully or partially powered-down logic tile is not in an undefined data state.

Figure 3C:
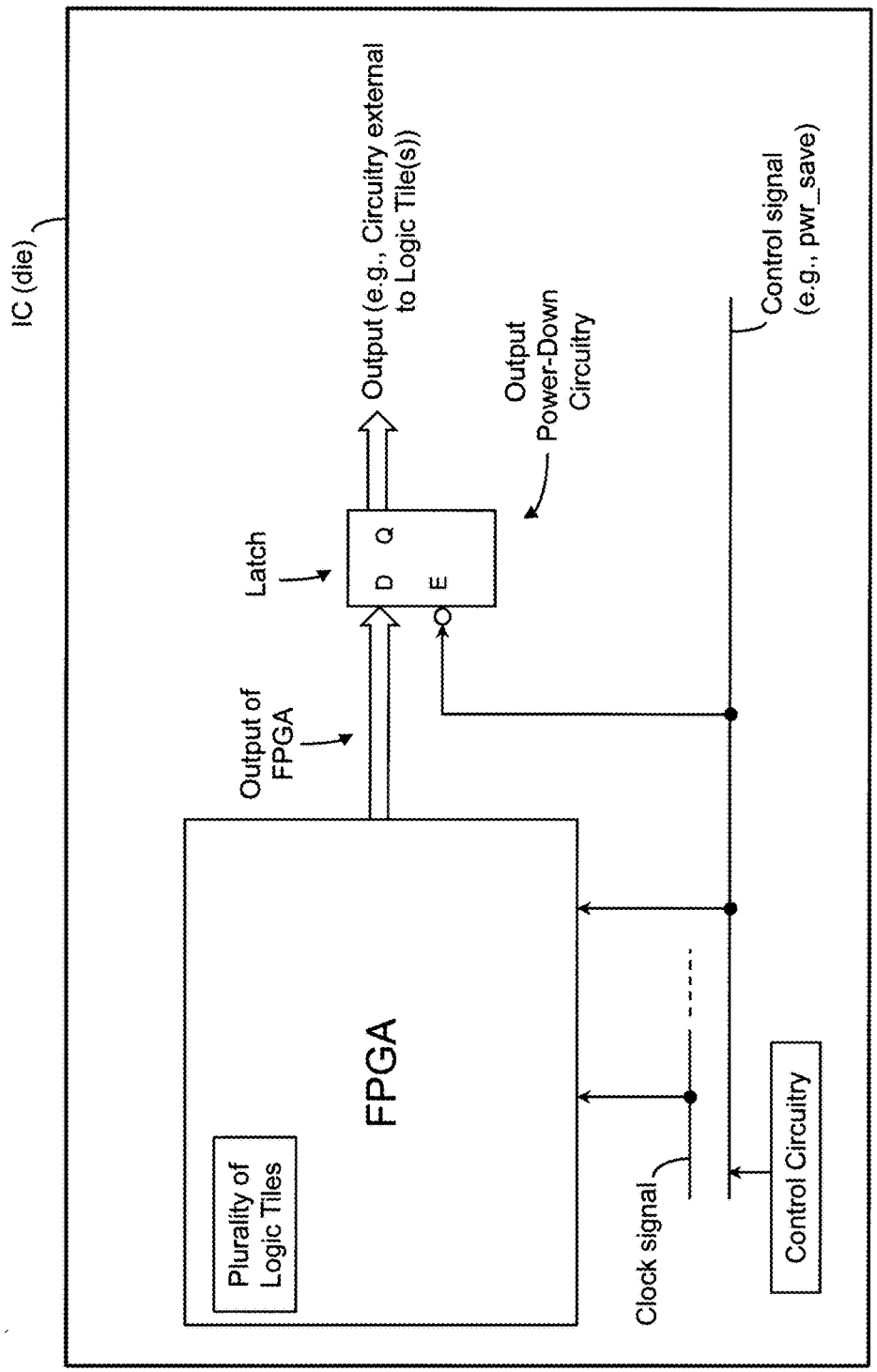
FIGS. 3C and 3D illustrates, in schematic block diagram form, exemplary embodiments of an integrated circuit (die) including an FPGA (for example, an embedded FPGA) having a plurality of logic tiles (for example, arranged in an array of rows and columns) and output power-down circuitry (which in this embodiment, includes a latch), coupled to I/O circuitry of one or more (or all) of the logic tiles, to maintain, latch and/or store (and make available at the output(s) of the output power-down circuitry) a data state on the associated I/Os of one or more (or all) logic tiles that is/are in a fully or partially powered-down state; in one embodiment, when the power-down control signal (pwr_save) is enabled, the signal applied to the enable input of the latch changes and thereby disabling the latch, which, in response, latches or stores (and makes available at the output(s) of the latch) the data state of the signal that is on the output data path of such one or more (or all) logic tiles immediately prior to establishing such logic tile(s) in a fully or partially powered-down state; notably, the output power-down circuit may be connected to a storage element (e.g., a F/F) located at the output of the I/O circuitry (see, e.g., I/O circuitry of FIG. 1C); in another embodiment, where one or more (or all) logic tiles is/are to be in a fully or partially powered-down state in the to be implemented FPGA configuration, the latch may latch or store (and make available at the output(s)) a known or fixed data state (which is provided or applied to the circuitry, for example, at start-up or initialization (which may be before, during/concurrently or after configuration of the logic tiles of the array of logic tiles); in each embodiment, notwithstanding one or more (or all) logic tiles is/are in a fully or partially powered-down state, the data state on the output(s) of the powered-down logic tiles are defined/known (i.e., not undefined as a result of the logic tile(s) being in a fully/partially powered-down state); in one embodiment, the latch is transparent type latch in that each latch is "open" wherein the data from the input (D) to the output (Q) flows/transfers through the latch unclocked/unimpeded; notably, the latch may be connected to the output data paths external to the FPGA (see FIG. 3C) or internal to the FPGA (see FIG. 3D)

In particular, with reference to FIG. 3C, in one embodiment, output power-down circuitry includes latches to receive the output signals of the FPGA (which includes a plurality of logic tiles) at the inputs. The outputs of the latches are provided to circuitry external to the logic tiles or FPGA. A control signal (pwr_save), output by control circuitry, responsively enables/disables the data latching operation of the circuitry. Notably, the control circuitry (which may be in the FPGA or external thereto) generates the control signal (pwr_save) which is provided to the FPGA wherein, in response, one or more selected logic tiles (or all of the logic tiles) are configured or programmed in a fully or partially powered-down state (see, e.g., FIGS. 2A-2J and 4A-4C).

The control signal (pwr_save), in addition to being employed to implement the power status of the one or more (or all) of the logic tiles, instructs the latches to maintain, latch and/or store a known, defined and/or fixed data state and provide such data state at the outputs. As such, the latches outputs the known, defined and/or fixed data state on the associated I/O of the FPGA when one or more selected logic tiles (or all of the logic tiles) are configured or programmed in a fully or partially powered-down state. Notably, in one embodiment, only the latches associated with those outputs of the FPGA that are associated with the logic tiles that are programmed or configured in a power-down state are controlled to maintain, latch and/or store a known, defined and/or fixed data state. The latches associated with those outputs of the FPGA that associated with those logic tiles that are in a powered-up state are not be controlled to latch and/or store a known, defined and/or fixed data state—but rather, such outputs may function/operate normally. Where, however, the entire array of logic tiles are programmed or configured in a power-down state, the latches associated with all of the outputs are programmed to maintain, latch and/or store a known, defined and/or fixed data state and output such state accordingly. In this way, the I/O of the fully or partially powered-down logic tiles, which coupled to circuitry external to the FPGA, are not in an undefined data state.

Notably, the output power-down circuitry may be disposed in the FPGA. (See, FIG. 3D). Moreover, other configurations/embodiments of the output power-down circuitry may be employed to maintain, latch and/or store (and make available at the output(s)) a known, defined and/or fixed data state on the associated I/O. (See, FIG. 3E). All such configurations/embodiments are intended to fall within the scope of the present inventions.

Figure 3D:
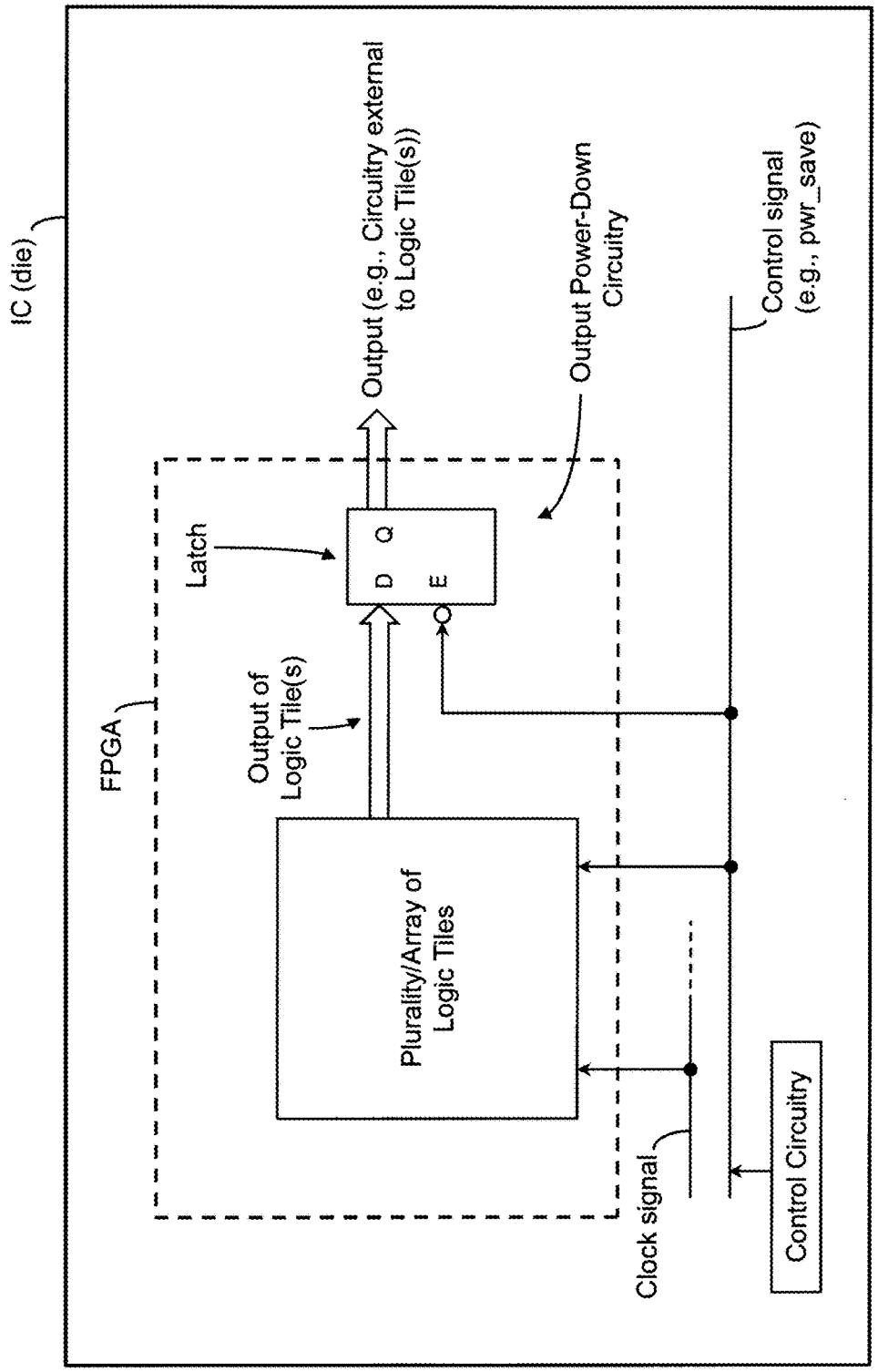
Figure 3E:
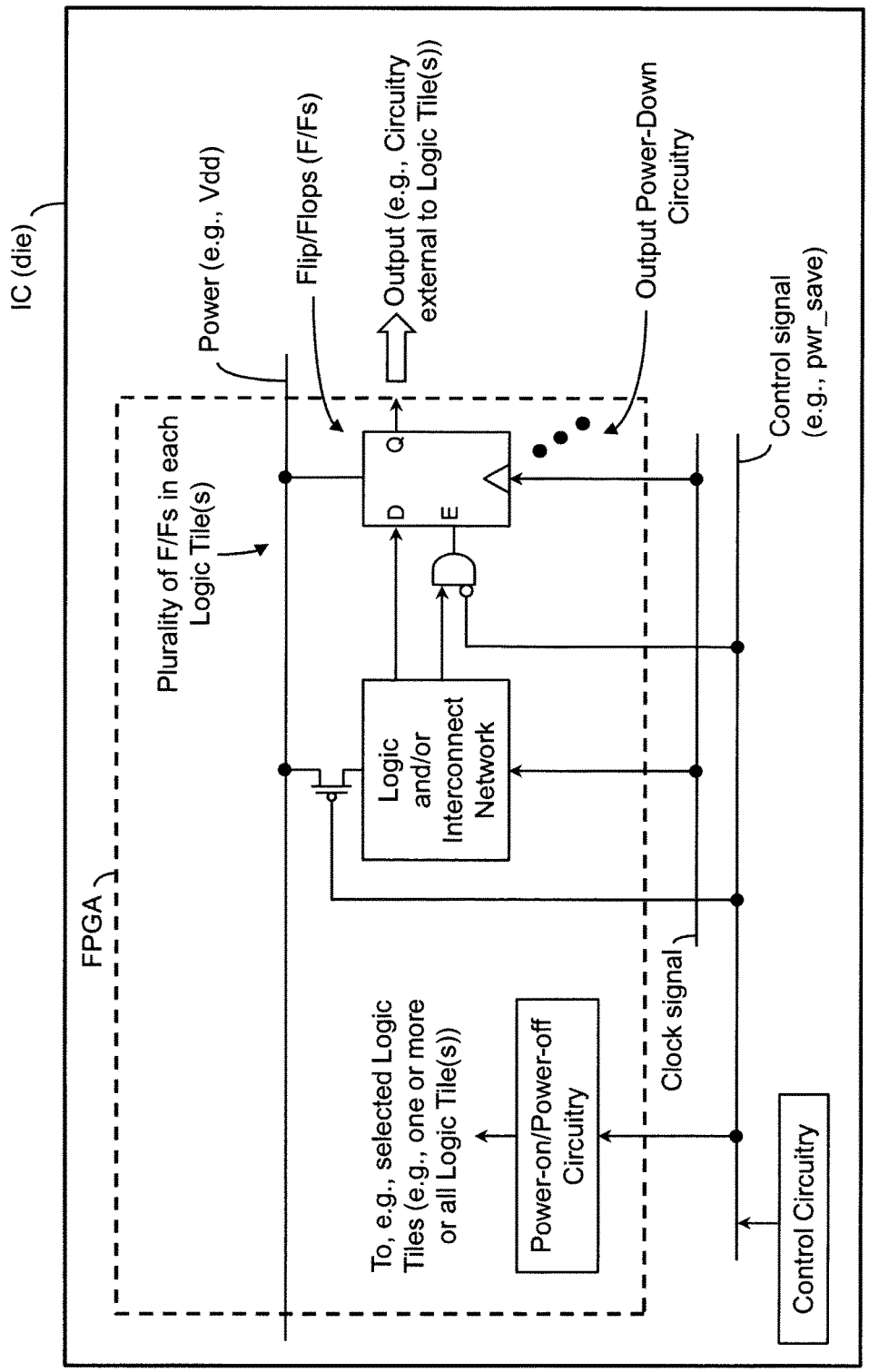
FIG. 3E illustrates another exemplary embodiment, in schematic block diagram form, of an integrated circuit (die) including an FPGA (for example, an embedded FPGA) having a plurality of logic tiles (for example, arranged in an array of rows and columns), wherein in this exemplary embodiment the output power-down circuitry connected to each logic tile includes a flip/flop (F/F), coupled to I/O circuitry of the logic tile and disposed in the output data paths of each logic tile, to maintain, latch and/or store a data state on the associated I/Os of the logic tiles that is/are in a fully or partially powered-down state; notably, as indicated above, the output power-down circuit may be connected to a storage element (e.g., a F/F) located at the output of the I/O circuitry (see, e.g., I/O circuitry of FIG. 1C); in this embodiment, a control signal is applied to control circuitry that responsively enables/disables storing "new" data while the circuit is in power-down state and the F/F maintains and stores the data state of the signal that is on the output data path of such one or more (or all) logic tiles when in a fully or partially powered-down state; that is, when the logic tile is in a fully or partially powered-down state, the F/F of the output power-down circuitry is in a data store mode and the F/F maintains, latches or stores a data state and outputs such state on the output data path of the associated logic tile; like that with respect to FIGS. 3C and 3D, in one embodiment, when the power-down control signal (e.g., pwr_save) is enabled, Vdd is disconnected from the logic and/or interconnect network of one or more (or all) of the logic tiles of the FPGA, and the signal applied to the enable input of the F/F changes and thereby disabling the F/F, which, in response, maintains, latches and/or stores (and makes available at the output(s) of the circuitry) the data state on the I/Os of such one or more (or all) logic tiles immediately prior to application of the power-down control signal and establishing such logic tile(s) in a fully or partially powered-down state; in another embodiment, where one or more (or all) logic tiles that is/are in a fully or partially powered-down state at initialization of the FPGA or integrated circuit, the F/F may latch or store (and makes available at the output(s)) a known or fixed state (which is provided or applied to the circuitry beforehand) that is latched or stored in such F/F for example, during initialization or re-initialization; in each embodiment, notwithstanding one or more (or all) logic tiles is/are in a fully or partially powered-down state, the data state on the output(s) of such one or more (or all) logic tiles are defined/known (i.e., not undefined)

Thus, in one embodiment, with reference to FIGS. 3C-3E, the integrated circuit (die) may include output power-down circuitry, coupled to I/O circuitry of one or more (or all) of the logic tiles, to maintain, latch and/or store (and make available at the output(s)) a known data state on the associated I/O of one or more (or all) logic tiles that is/are in a fully or partially powered-down state. Notably, the I/O illustrated here may be representative of, among other things, a plurality of output data paths. When the power-down control signal (pwr_save) is enabled, the signal applied to the enable input of the latch or F/F disables such element which, in response causes the latch or F/F to latch or store (and make available at the output(s)) the data state(s) of the signal that is/are on the output data path(s) of such one or more (or all) logic tiles immediately prior to establishing such logic tile(s) in a fully or partially powered-down state (i.e., immediately prior to applying the power-down control signal (pwr_save) to such one or more (or all) logic tiles). In this way, notwithstanding one or more (or all) logic tiles is/are in a fully or partially powered-down state, the output power-down circuitry of the powered-down logic tiles of the FPGA maintain or output a defined/known data state (i.e., here, the output power-down circuitry on or for each output of the associated logic tile stores or latches the last known data state of the data output by the output power-down circuitry).

Notably, with reference to FIG. 3E, power applied to the logic and/or interconnect network is disabled when the power-down control signal (pwr_save) is enabled/applied. However, power is still applied to the output power-down circuitry when the logic tile(s) is/are in a fully or partially powered-down state.

In one embodiment, the known, defined or determined data state on the associated output data path is the data state immediately prior to establishing such logic tile(s) in a fully or partially powered-down state. In this regard, upon application of the control signal to the latch (FIGS. 3C and 3D) and F/F (FIG. 3E), the latch and F/F stores and outputs the data state of the output signal when the enable control input of the latch and F/F changes in response to application of the control signal. (See, e.g., FIGS. 3C-3E).

Where one or more (or all) logic tiles is/are in a fully or partially powered-down state at initialization of the FPGA, the control circuitry, during for the power-up initialization of the FPGA or integrated circuit, for example, may apply a known or fixed data state to the latch or F/F which, in response, may latch or store (and make available at the output(s)) that known or fixed data state after initialization. Here, the known or fixed data state is provided or applied to the latch or F/F, for example, at start-up or initialization or re-initialization, and/or in response to reset or the like sequence/operation (which may be before, during/concurrently or after configuration of the logic tiles of the array of logic tiles). As such, during operation of the FPGA or the IC, the latch or F/F of the FPGA (in the event the entire FPGA is powered down) and/or one or more (or all) powered-down logic tiles store(s) and output(s) a defined/known data state to circuitry coupled thereto.

With reference to FIGS. 3C and 3D, the latch may be a transparent type latch in that each latch is "open" wherein the data path from the input (D) to the output (Q) flows/transfers through the latch unclocked/unimpeded. Moreover, the latch may be disposed outside of the FPGA and connected to the output data paths outside of the FPGA (see FIG. 3C) or in the FPGA and connected to the output data paths inside the FPGA (see FIG. 3D).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, in one embodiment, the power state of one or more of the logic tiles may be partially powered-down (a portion of the circuitry of the logic tile receives electrical power and the remaining portion of the circuitry does not) and/or the power state of one or more of the other logic tiles may be completely powered-down (none of the circuitry of the logic tile receives electrical power; that is, no electrical power is provided or applied to and/or consumed or generated by the logic tile). The partial powered-down state may include removing, terminating and/or not providing electrical power to one or more significant portions or features of the logic tile such as, for example, the interconnect network (or a portion thereof), the computing elements (or a portion thereof), clock generation or clock control circuitry, and/or the I/O circuitry (or a portion thereof). All permutations and combinations of number of powered-up and powered-down logic tiles, spatial relationship of the powered-up and powered-down logic tiles, and locations thereof within the array (i.e., on a perimeter or in the interior), are intended to fall within the scope of the present inventions.

Figure 4A:
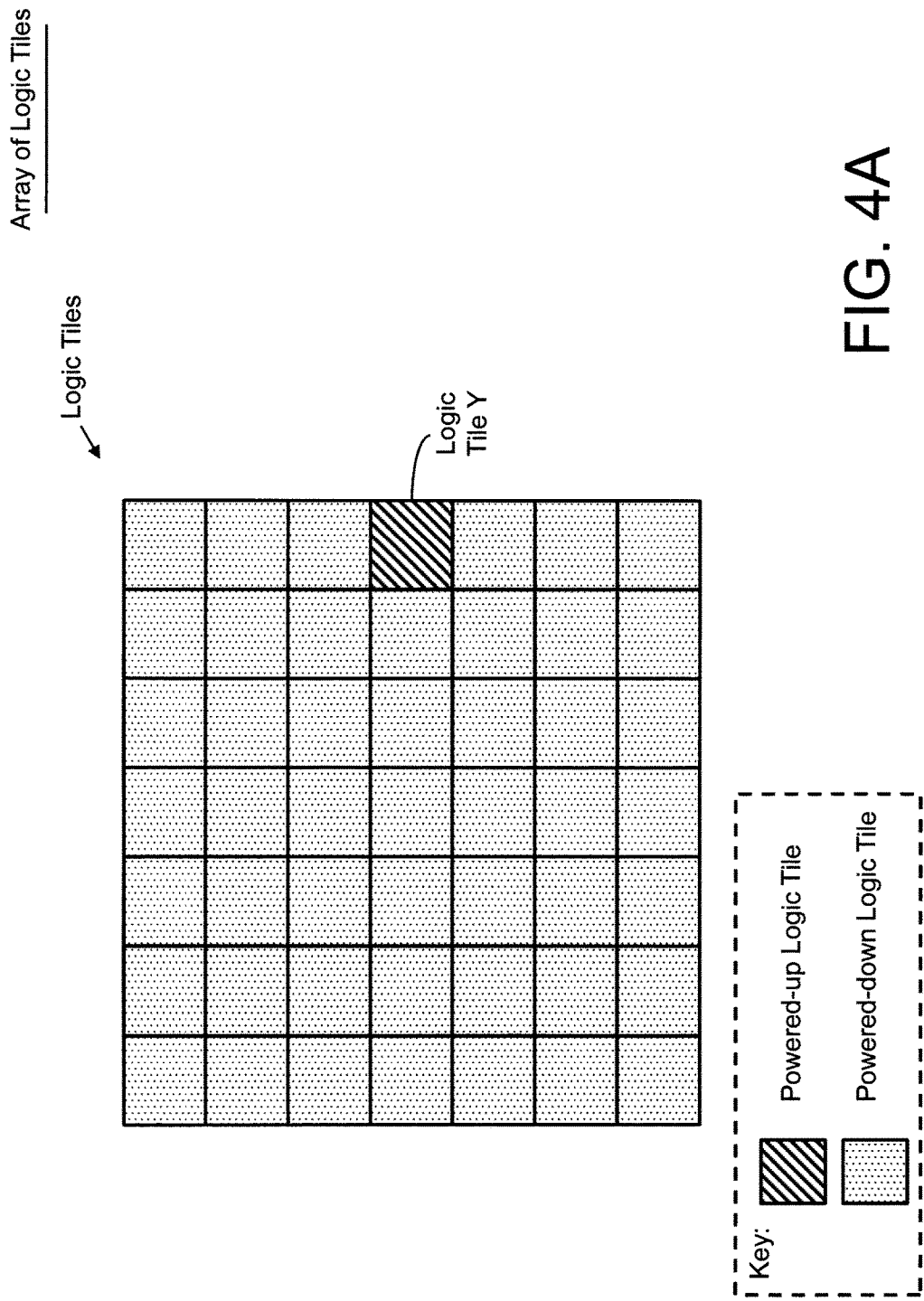
FIGS. 4A and 4B illustrate, in block diagram form, exemplary embodiments of a physical array of a plurality of logic tiles of programmable/configurable logic circuitry of an FPGA wherein, in normal operation of the FPGA, (i) one or more of the logic tiles are partially powered-down (i.e., a portion of the circuitry of the logic tile receives electrical power and the remaining portion of the circuitry does not) and/or the power state of one or more of the other logic tiles may be completely powered-down (none of the circuitry of the logic tile receives electrical power; that is, no electrical power is provided or applied to and/or generated by the logic tile) and (ii) one or more logic tiles are powered-up (i.e., electrical power is provided or applied to and/or generated by the logic tile); notably, the logic tile that is always on may be any of the logic tiles of the array of logic tiles—for example, in one embodiment, the power state of each of Logic Tile Y (FIG. 4A) is not programmable or configurable (i.e., the logic tile is always powered-up or powered-on) and, in another embodiment, the Logic Tile Z (FIG. 4B) is not powered-up/powered-down programmable or configurable (i.e., the logic tile is always powered-up or powered-on); notably, all permutations and combinations of at least one logic tile that is powered-down and at least one logic tile that is powered-up—the location of which may be anywhere in the array of logic tiles—are intended to fall within the scope of the present inventions; the "Key", set forth in FIG. 2A, is applicable to all of the embodiments illustrated in FIGS. 4A and 4B.
Figure 4B:
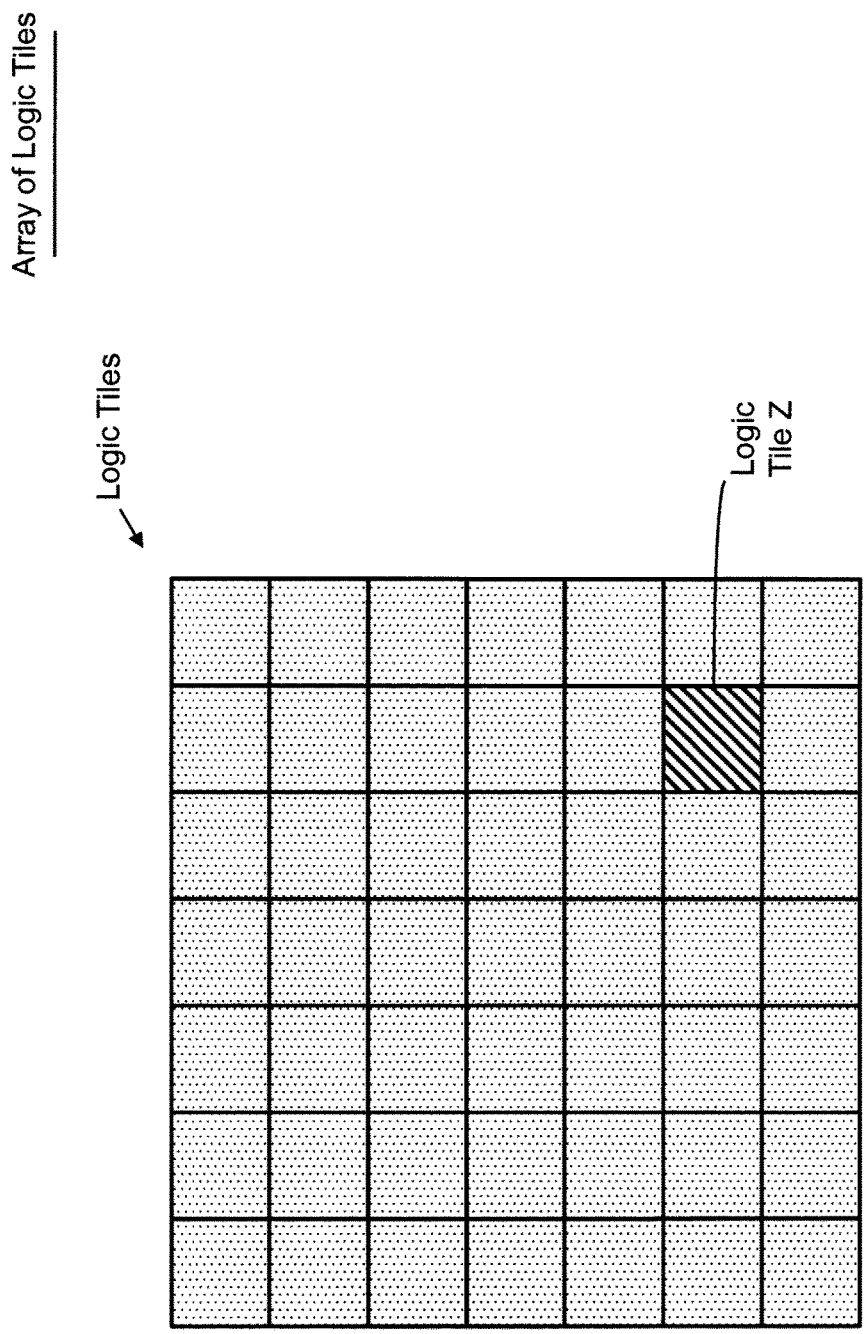
Figure 4C:
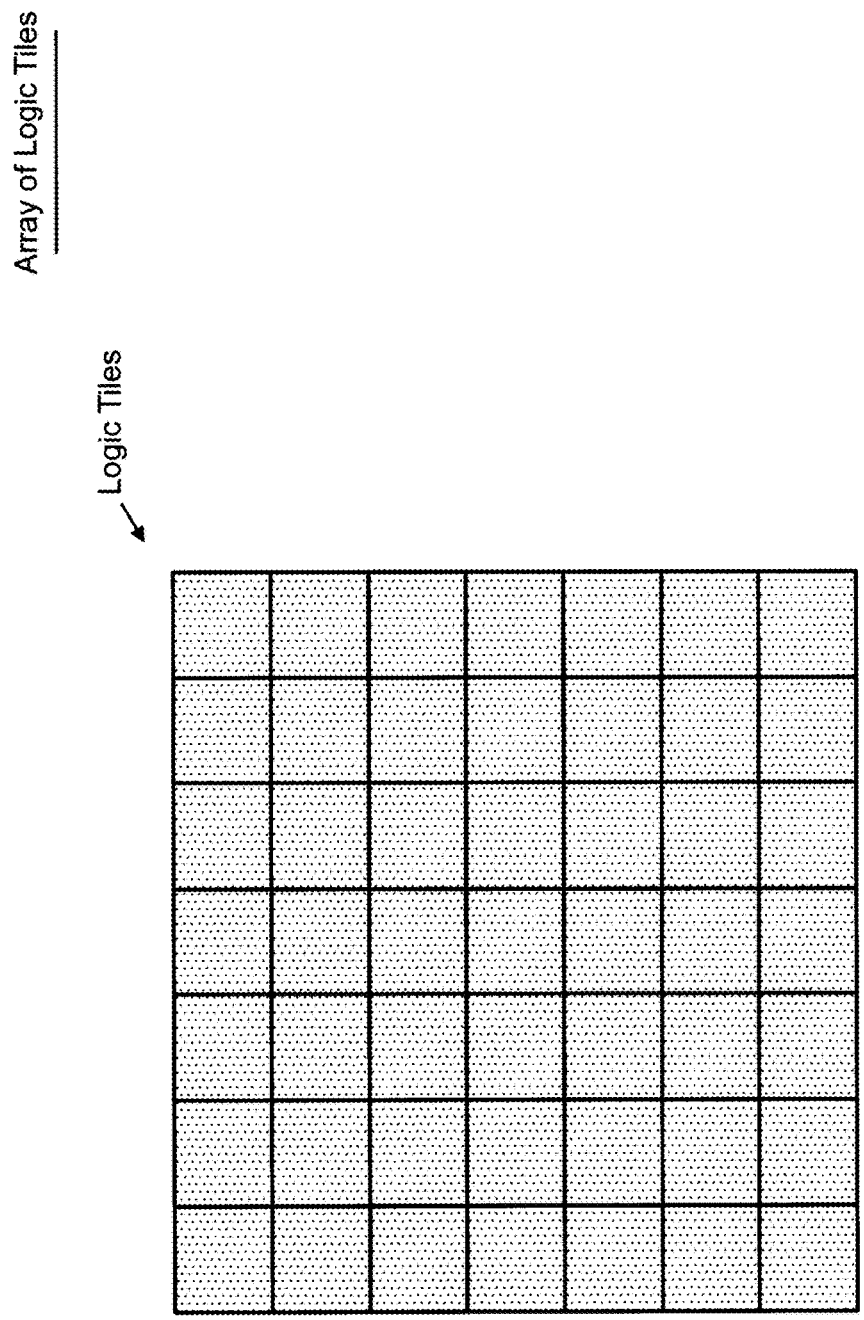
FIG. 4C illustrates, in block diagram form, an exemplary embodiment of a physical array of a plurality of logic tiles of programmable/configurable logic circuitry of an FPGA wherein, in normal operation of the FPGA, all of the logic tiles are partially powered-down (i.e., a portion of the circuitry of the logic tile receives electrical power and the remaining portion of the circuitry does not) and/or completely powered-down (none of the circuitry of the logic tile receives electrical power; that is, no electrical power is provided or applied to and/or generated by the logic tile); the "Key", set forth in FIG. 2A, is applicable to all of the embodiments illustrated in FIG. 4C.

For example, although the logic tile that is always in a powered-up state is illustrated in the bottom row, right column (See, for example, Logic Tile x in FIGS. 2A-2J), such logic tile may be located anywhere in the array including, for example, in a different location on the perimeter (see Logic Tile Y in FIG. 4A) or in the interior of the array (see Logic Tile Z in FIG. 4B). Thus, in one embodiment, the power state of each of Logic Tile Y (FIG. 4A) is not programmable or configurable (i.e., the logic tile is always powered-up or powered-on) and, in another embodiment, the Logic Tile Z (FIG. 4B) is not powered-up/powered-down programmable or configurable (i.e., the logic tile is always powered-up or powered-on). All permutations and combinations of the locations and configuration of at least one logic tile that is powered-down and at least one logic tile that is powered-up are intended to fall within the scope of the present inventions. Notably, the embodiments of the logic tile which is not programmable or configurable being located anywhere within the array may be implemented in any of the embodiments illustrated in FIGS. 2B-2J.

Figure 5A:
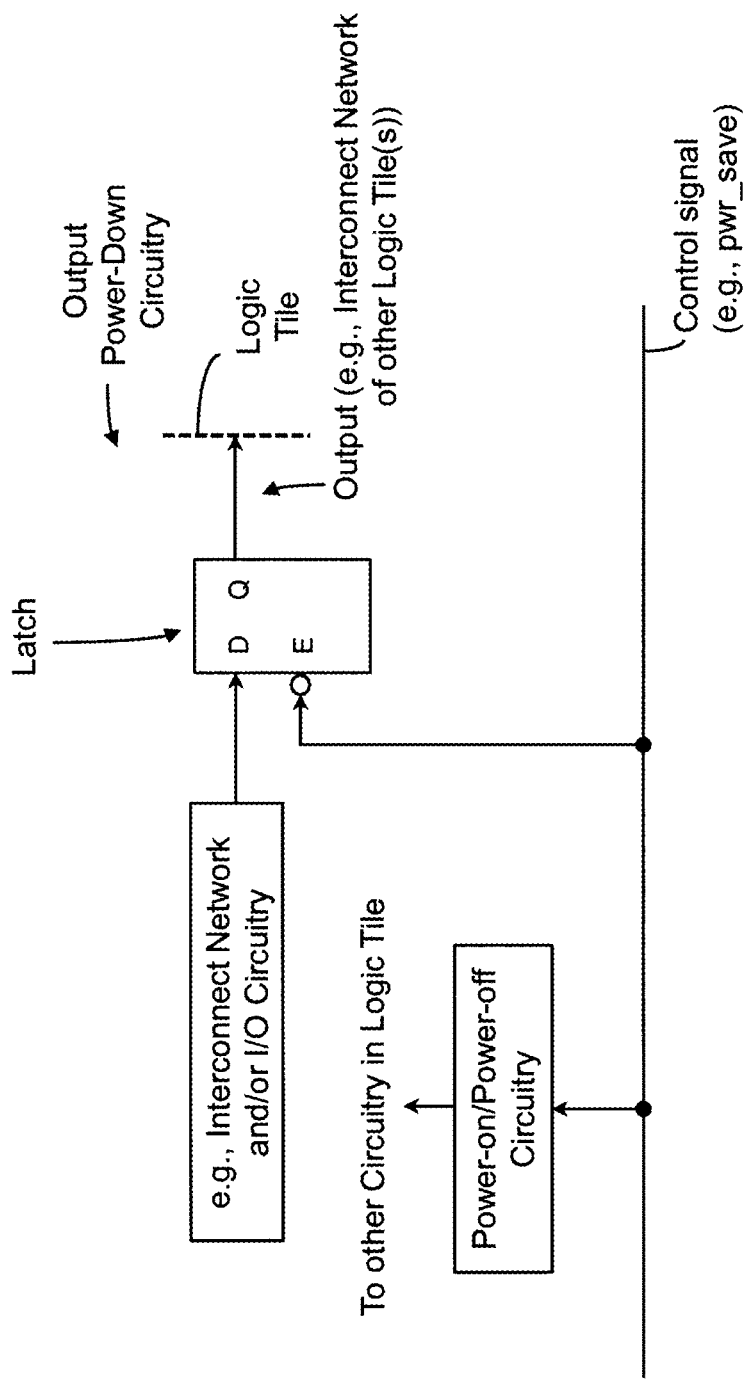
FIGS. 5A and 5B illustrate, in a schematic block diagram form, an output power-down circuitry of a logic tile of an FPGA, wherein in these exemplary embodiments, each output data path of the logic tile includes the output power-down circuitry (including the F/F and/or latch) to maintain, store and/or latch (and output) a known data state if/when the logic tile is in a fully or partially powered-down state; here, the output of the logic tile may be, for example, connected to the interconnect network of another logic tile or circuitry external to the FPGA; notably, the operation of such circuitry is similar to that described above with respect to FIGS. 3C-3E.
Figure 5B:
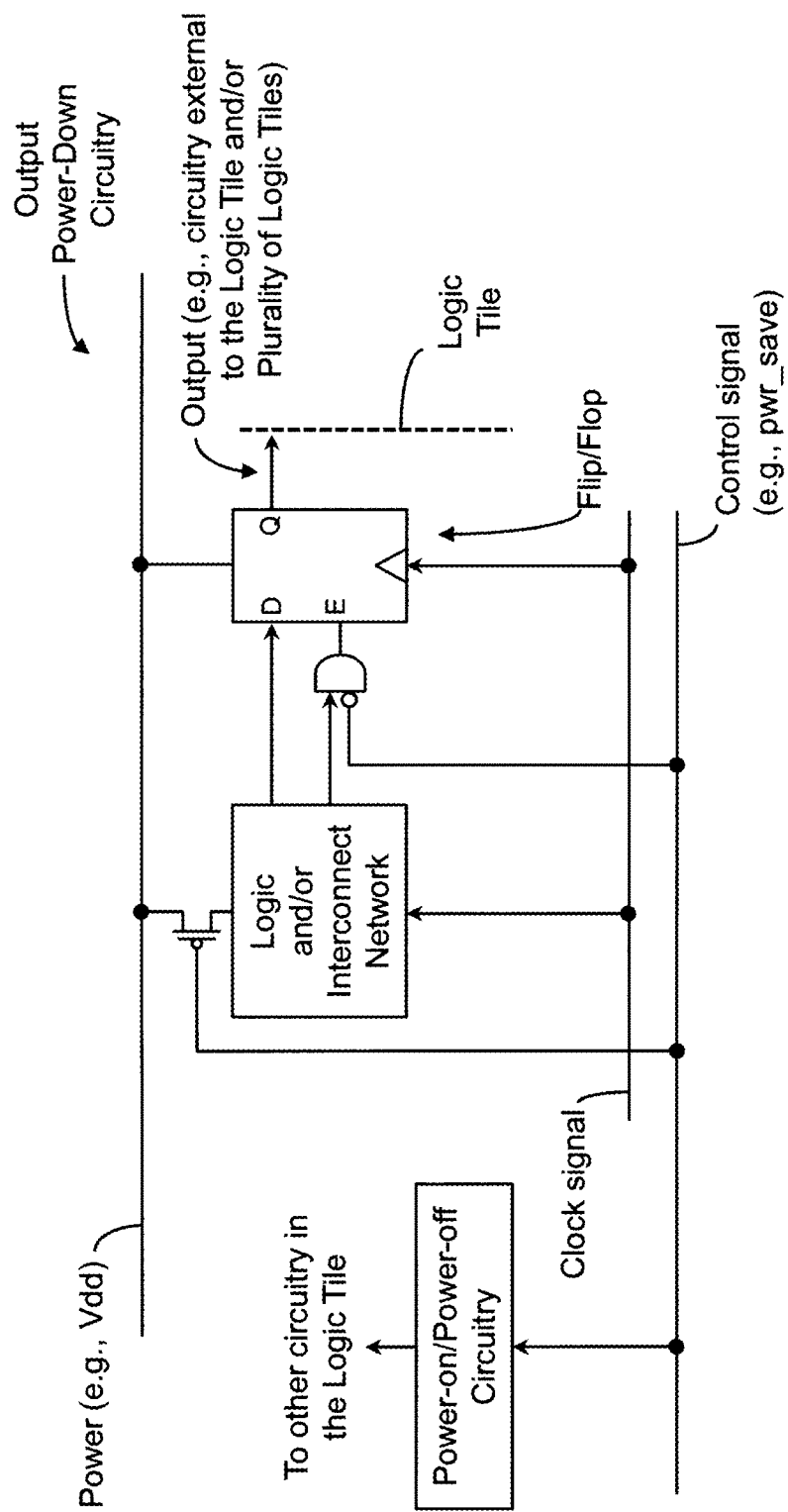

Notably, in one embodiment, each logic tile includes output power-down circuitry on each of the outputs of the logic tile to ensure that the data state on the output of each logic tile of the FPGA is in a defined/known (i.e., not undefined) notwithstanding a logic tile may be in a fully or partially powered-down state. For example, with reference to FIGS. 5A and 5B, in one embodiment, each output of the logic tile includes output power-down circuitry. The output power-down circuitry, in one exemplary embodiment, includes F/Fs and in another embodiment includes latches—both to store or latch a known data state after/upon application of the control signal to place the logic tile in a fully or partially powered-down state. The operation of these embodiments is similar to that described above with respect to FIGS. 3C-3E. For the sake of brevity, a discussion of that operation will not be repeated.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "logic tile" means a design unit or block of a plurality of transistors (typically more a tens of thousand) that are connected or configured, for example, into programmable components (e.g., programmable logic components), which, in this application, is capable of connecting to one or more neighboring "logic tiles" (for example, in or during operation). The term (i) "integrated circuit" means, among other things, a processor, controller, state machine, gate array, SOC, PGA and/or FPGA.

In addition, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The term "initialization operation" means the power-up, start-up, initialization, re-initialization, configuration, and/or re-configuration operation of the FPGA, programmable/ configurable logic circuitry, one or more logic tiles and/or the integrated circuit.

What is claimed is:

1. An integrated circuit comprising:
a field programmable gate array including:
   a plurality of logic tiles, wherein, during operation of the field programmable gate array, each logic tile is configurable to connect with at least one logic tile of the plurality of logic tiles, and wherein each logic tile of the plurality of logic tiles includes:
      an interconnect network including a plurality of multiplexers, and
      logic circuitry configurable to perform combinational and/or sequential operations;
   wherein, the field programmable gate array, in operation, includes:
      a first group of logic tiles of the plurality of logic tiles are programmed in a powered-up state such that the interconnect network and logic circuitry of each logic tile of the first group of logic tiles receives and consumes electrical power during operation of the field programmable gate array, and
      a second group of logic tiles of the plurality of logic tiles are programmed in a powered-down state such that the interconnect network of each logic tile of the second group of logic tiles is disabled, wherein, when the interconnect network is disabled, the plurality of multiplexers thereof do not consume electrical power during operation of the field programmable gate array.

2. The integrated circuit of claim 1 wherein:
the plurality of logic tiles of the field programmable gate array are arranged in an array of rows and columns, and the first and second group each includes one or more logic tiles.

3. The integrated circuit of claim 1 wherein:
each logic tile of the plurality of logic tiles further includes power-on/power-off circuitry to responsively enable and disable consumption of power by the plurality of multiplexers in the associated logic tile during operation of the field programmable gate array.

4. The integrated circuit of claim 3 wherein:
the power-on/power-off circuitry includes one or more switches which responsively connect or disconnect electrical power to the plurality of multiplexers of the interconnect network in the associated logic tile during operation of the field programmable gate array.

5. The integrated circuit of claim 1 wherein:
each logic tile of the plurality of logic tiles further includes output power-down circuitry to output a known or fixed data state on each of the output data paths of the associated logic tile when the logic tiles are programmed in a powered-down state.

6. The integrated circuit of claim 1 wherein:
when the second group of logic tiles of the plurality of logic tiles are programmed in the powered-down state, the logic circuitry of each logic tile of the second group of logic tiles is disabled, wherein, when the logic circuitry is disabled, the logic circuitry does not consume electrical power during operation of the field programmable gate array.

7. The integrated circuit of claim 1 wherein:
output power-down circuitry is connected to one or more outputs of the logic tiles to store a known or fixed data state when the logic tiles are programmed in a powered-down state.

8. The integrated circuit of claim 7 wherein:
the output power-down circuitry includes one or more latches or flip/flops to store the known or fixed data state when the logic tiles are programmed in a powered-down state.

9. An integrated circuit comprising:
a field programmable gate array including:
an array of logic tiles, wherein, during operation of the field programmable gate array, each logic tile of the array of logic tiles is configurable to connect with at least one logic tile of the array of logic tiles, and wherein each logic tile of the array of logic tiles includes:
a plurality of multiplexers configurable into an interconnect network, and
logic circuitry configurable to perform combinational and/or sequential operations;
wherein, the field programmable gate array, in a first operational mode, includes:
a plurality of logic tiles of the array of logic tiles programmed in a powered-up state such that each logic tile of the plurality of logic tiles receives and consumes electrical power during operation of the field programmable gate array, and
at least one logic tile of the array of logic tiles programmed in a partial powered-down state such that the interconnect network of the at least one logic tile is disabled wherein, when the interconnect network is disabled, the plurality of multiplexers thereof do not consume electrical power during operation of the field programmable gate array.

10. The integrated circuit of claim 9 wherein:
the at least one logic tile of the array of logic tiles further includes power-on/power-off circuitry to responsively disable consumption of power by the plurality of multiplexers in the at least one logic tile when the field programmable gate array is in the first operational mode.

11. The integrated circuit of claim 10 wherein:
the power-on/power-off circuitry includes one or more switches which responsively disconnect electrical power to the plurality of multiplexers of the at least one logic tile when the field programmable gate array is in the first operational mode.

12. The integrated circuit of claim 9 wherein:
the at least one logic tile of the array of logic tiles further includes output power-down circuitry to output a known or fixed data state on each of the output data paths of the at least one logic tile when the field programmable gate array is in the first operational mode.

13. The integrated circuit of claim 9 wherein:
when the at least one logic tile of the array of logic tiles is programmed in the powered-down state, the logic circuitry of each logic tile of the at least one logic tile of the array of logic tiles is disabled, wherein, when the logic circuitry is disabled, the logic circuitry does not consume electrical power during operation of the field programmable gate array.

14. An integrated circuit comprising:
a field programmable gate array including:
an array of logic tiles, wherein, during operation of the field programmable gate array, each logic tile of the array of logic tiles is configurable to connect with at least one logic tile of the array of logic tiles, and wherein each logic tile of the array of logic tiles includes:
a plurality of multiplexers configurable into an interconnect network, and
logic circuitry configurable to perform combinational and/or sequential operations;
wherein, the field programmable gate array, in a first operational mode, includes:
at least one logic tile of the array of logic tiles programmed in a powered-up state such that the at least one logic tile receives and consumes electrical power during operation of the field programmable gate array, and
a plurality of logic tiles of the array of logic tiles programmed in a powered-down state to disable the interconnect network of each logic tile of the plurality of logic tiles of the array of logic tiles, wherein, when the interconnect network is disabled, the plurality of multiplexers of each logic tile of the plurality of logic tiles do not consume electrical power during operation of the field programmable gate array.

15. The integrated circuit of claim 14 wherein:
each logic tile of the plurality of logic tiles further includes power-on/power-off circuitry to responsively disable consumption of power by the plurality of multiplexers therein when the field programmable gate array is in the first operational mode.

16. The integrated circuit of claim 15 wherein:
the power-on/power-off circuitry includes one or more switches which responsively disconnect electrical power to the plurality of multiplexers of each logic tile of the plurality of logic tiles when the field programmable gate array is in the first operational mode.

17. The integrated circuit of claim 14 wherein:
each logic tile of the plurality of logic tiles further includes output power-down circuitry to output a known or fixed data state on each of the output data paths of the plurality of logic tiles when the field programmable gate array is in the first operational mode.

18. The integrated circuit of claim 14 wherein:
when the plurality of logic tiles of the array of logic tiles are programmed in the powered-down state, the logic circuitry of each logic tile of the plurality of logic tiles of the array of logic tiles is disabled, wherein, when the logic circuitry is disabled, the logic circuitry does not consume electrical power during operation of the field programmable gate array.

19. The integrated circuit of claim 14 wherein:
at least one logic tile of the plurality of logic tiles is programmed in a partial powered-down state.

20. The integrated circuit of claim 14 wherein:
the plurality of logic tiles are programmed in a partial powered-down state.

* * * * *